US012288014B1

(12) United States Patent
Romero et al.

(10) Patent No.: US 12,288,014 B1
(45) Date of Patent: Apr. 29, 2025

(54) SYSTEMS AND METHODS FOR PREDICTIVE MODELING

(71) Applicant: MASSACHUSETTS MUTUAL LIFE INSURANCE COMPANY, Springfield, MA (US)

(72) Inventors: Julia Romero, New York, NY (US); Matthew Wolf, New York, NY (US); Mark Sayre, New York, NY (US); Marc Maier, New York, NY (US); Shanshan Li, New York, NY (US)

(73) Assignee: Massachusetts Mutual Life Insurance Company, Springfield, MA (US)

( * ) Notice: Subject to any disclaimer, the term of this patent is extended or adjusted under 35 U.S.C. 154(b) by 0 days.

(21) Appl. No.: 18/828,964

(22) Filed: Sep. 9, 2024

Related U.S. Application Data

(63) Continuation-in-part of application No. 17/144,847, filed on Jan. 8, 2021, which is a continuation-in-part of application No. 16/786,772, filed on Feb. 10, 2020, now abandoned.

(51) Int. Cl.
*G06F 30/27* (2020.01)
*G06N 20/20* (2019.01)

(52) U.S. Cl.
CPC ............ *G06F 30/27* (2020.01); *G06N 20/20* (2019.01)

(58) Field of Classification Search
CPC ......... G06F 30/00; G06F 30/27; G06N 20/20; G06N 20/00
USPC ........................................................... 703/2
See application file for complete search history.

(56) References Cited

U.S. PATENT DOCUMENTS

| 8,521,568 B1 | 8/2013 | Easley |
| 2003/0037063 A1 | 2/2003 | Schwartz |
| 2003/0177032 A1 | 9/2003 | Bonissone et al. |
| 2009/0204446 A1 | 8/2009 | Simon et al. |

(Continued)

FOREIGN PATENT DOCUMENTS

| WO | WO-2015084548 A1 * | 6/2015 | ............. G06Q 40/08 |
| WO | WO-2017/220140 A1 | 12/2017 | |

OTHER PUBLICATIONS

Perumalsamy, Jegatheeswari et al. "AI-Driven Risk Modeling in Life Insurance: Advanced Techniques for Mortality and Longevity Prediction", Jul.-Dec. 2023, Journal of Artificial Intelligence Research and Applications, vol. 3, Issue 2, Semi Annual Edition. (Year: 2023).*

(Continued)

*Primary Examiner* — Cedric Johnson
(74) *Attorney, Agent, or Firm* — Foley & Lardner LLP

(57) ABSTRACT

Discussed herein are methods and systems for an interdependent series/suite of AI models. In one embodiment, a processor receives projection assumption inputs from a user device and executes a population builder machine learning model to predict a dynamic adjustment table. It applies the model to population data to generate a value population file, which simulates a subset of the population based on the predicted table. The file contains value cells representing instances of a product. The device then runs a mortality machine learning model to determine mortality data for the product using the simulated population. Finally, it executes a flow projection model to generate a projection report for the product, incorporating mortality data and projection assumptions.

20 Claims, 15 Drawing Sheets

(56) References Cited

U.S. PATENT DOCUMENTS

| | | |
|---|---|---|
| 2009/0265190 A1 | 10/2009 | Ashley et al. |
| 2013/0173283 A1 | 7/2013 | Morse et al. |
| 2015/0039351 A1 | 2/2015 | Bell et al. |
| 2015/0287143 A1 | 10/2015 | Gabriel et al. |
| 2015/0294420 A1 | 10/2015 | Hu |
| 2019/0095307 A1 | 3/2019 | Rugel et al. |
| 2019/0180379 A1 | 6/2019 | Nayak et al. |
| 2020/0321122 A1 | 10/2020 | Neumann |

OTHER PUBLICATIONS

Devriendt, Sander, "Sparse Predictive Modeling Techniques with Applications in Insurance Pricing and Mortality Forecasting", 2021, Facility of Economics and Business, No. 755, Ku Leuven. (Year: 2021).*

Hong, Wei Hong et al., "Forecasting Mortality Rates Using Hybrid Lee-Carter Model, Artificial Neural Network and Random Forest", 2021, Complex & Intelligent Systems, Springer. (Year: 2021).*

Aggour, K. S.; Bonissone, P. P.; Cheetham, W. E.; and Messmer, R. P. 2006. Automating the underwriting of insurance applications. AI magazine 27(3):36; Sep. 2006; 12 pages.

Case, A., and Deaton, A. 2015. Rising morbidity and mortality in midlife among white non-hispanic Americans in the 21st century. Pmc. of the National Academy of Sciences 112(49): 15078-15083; Sep. 17, 2015; 6 pages.

Chokshi, D. A.; El-Sayed, A. M.; and Stine, N. W. 2015. J-shaped curves and public health. JAMA 314(13):1339-1340; Oct. 6, 2015; 2 pages.

Cox, H. J.; Bhandari, S.; Rigby, A. S.; and Kilpatrick, E. S. 2008. Mortality at low and high estimated glomerular filtration rate values: A u-shaped curve. Nephron Clinical Practice 110(2):c67-c72; Feb. 19, 2008; 6 pages.

David B. Atkinson, et al., "Experience Study Calculations", Society of Actuaries, Oct. 2016, 114 pages.

Final Office Action on U.S. Appl. No. 17/144,847 dated Oct. 6, 2022 (14 pages).

Guizhou Hu, Mortality Assessment Technology: A New Tool for Life Insurance Underwriting, On The Risk, vol. 18, No. 3, https://pdfs.semanticscholar.org/bac0/3b8a85bf89c7a7b65076c082632d2d325519.pdf, 2002, 9 pages.

Hemant Ishwaran, Udaya B Kogalur, Eiran Z Gorodeski, Andy J Minn, and Michael S Lauer. High-dimensional variable selection for survival data. Journal of the American Statistical Association, 105(489):205-217, Nov. 2008, 13 pages.

Hemant Ishwaran, Udaya B Kogalur, Eugene H Blackstone, and Michael S Lauer. Random Survival Forests. The Annals of Applied Statistics, 2(3):841-860; Mar. 2008, 22 pages.

Kalben, B. B. 2000. Why men die younger: Causes of mortality differences by sex. N. Am. Actuarial Journal 4(4):83-111; Jan. 4, 2013; 30 pages.

Kaplan, E. L., and Meier, P. 1958. Nonparametric estimation from incomplete observations. Journal of the American Statistical Association 53(282):457-481; Jun. 1958; 25 pages.

Katzman, J.; Shaham, U.; Bates, J.; Cloninger, A.; Jiang, T.; and Kluger, Y. 2016. Deep survival: A deep cox proportional hazards network. arXiv preprint arXiv: 1606.00931; Jun. 2016; 11 pages.

Kronmal, R. A.; Cain, K. C.; Ye, Z.; and Omenn, G. S. 1993. Total serum cholesterol levels and mortality risk as a function of age: A report based on the Framingham data. Archives of Internal Medicine 153 (9):1065-1073; May 10, 1993; 9 pages.

Iveta Dirgova Luptakovaiveta and Maria Bilfkovamaria, "Actuarial Modeling of Life Insurance Using Decrement Models", Journal of Applied Mathematics, Statistics and Informatics, vol. 10: Issue 1; Jul. 15, 2014, 11 pages.

Marc Maier, Hayley Carlotto, Freddie Sanchez, Sherriff Balogun, Sears Merritt; "Transforming Underwriting in the Life Insurance Industry"; Proceedings of the Thirty-Third AAAI Conference on Artificial Intelligence, vol. 33 (2019):; Jul. 17, 2019; 8 pages.

Marco Aleandri, "Data Science In Insurance", SAO Research Dissertation, Institute and Faculty of Actuaries, May 10, 2019, 206 pages.

Matt Monson et al., "Determining VM-20 Mortality for Accelerated Underwriting Programs", The Financial Reporter, Society of Actuaries, Financial Reporting Section; Issue 114, Sep. 2018, 36 pages.

Mike Batty et al., Predictive Modeling for Life Insurance: Ways Life Insurers can participate in the Business Analytics Revolution, Deloitte Consulting LLP, Apr. 2010, 29 pages.

National Association of Insurance Commissioners. Credit-based insurance scores, 2018. httQs:// www.naic.org/ciQr to12ics/to12ic credit based insurance score. html, last updated Dec. 7, 2018, 3 pages.

Non-Final Office Action for U.S. Appl. No. 16/786,772 dated Aug. 17, 2021 (33 pages).

Non-Final Office Action on U.S. Appl. No. 17/144,847 dtd Oct. 10, 2024.

Non-Final Office Action on U.S. Appl. No. 17/144,847 dated Jun. 2, 2022 (17 pages).

Peter WF Wilson, Ralph B D'Agostino, Daniel Levy, Albert M Belanger, Halit Silbershatz, and William B Kannel. Prediction of coronary heart disease using risk factor categories. Circulation, 97(18):1837-1847, May 1998; 11 pages.

Ranganath, R.; Perotte, A.; Elhadad, N.; and Blei, D., 2016. Deep survival analysis. arXiv preprint arXiv: 1608.02158; Aug. 6, 2016; 13 pages.

Rocco Roberto Cerchiara et al., "Generalized Linear Models in Life Insurance: Decrements and Risk Factor Analysis under Solvency II," Working paper presented at the AFIR Colloquium in Rome, 2008, 18 pages.

Rosinger, A.; Carroll, M. D.; Lacher, D.; and Ogden, C. 2017. Trends in total Cholesterol, Triglycerides, and Low-density Lipoprotein in US Adults, 1999-2014. JAMA Cardiology 2(3):339-341; Mar. 2017; 3 pages.

Scism, L. 2017. New York regulator seeks details from life insurers using algorithms to issue policies. The Wall Street Journal; Jun. 29, 2017; 2 pages.

* cited by examiner

SYSTEMS AND METHODS FOR PREDICTIVE MODELING

CROSS-REFERENCE TO RELATED APPLICATIONS

The present application is a continuation-in-part of U.S. patent application Ser. No. 17/144,847, filed Jan. 8, 2021, which is a continuation-in-part of U.S. patent application Ser. No. 16/786,772, filed Feb. 10, 2020, both of which are hereby incorporated by reference in their entirety.

TECHNICAL FIELD

The present disclosure relates generally to using suites of interconnected computer models using prediction techniques and artificial intelligence.

BACKGROUND

Various entities evaluate mortality risk and its financial impact when developing products. Specifically, these entities use computer modeling techniques to simulate various attributes of a product. However, using conventional computer modeling techniques have faced several technical shortcomings. For instance, some simulations require assumptions about expected mortality rates and other factors. Systems and methods for modeling mortality rates and other factors typically derive assumptions about expected mortality rates and derive other assumptions such as user behaviors from a combination of observed mortality experience within a company and industrywide life tables. Therefore, conventional computer modeling tools are inefficient, requiring extensive manual processes using static assumption tables. The brute force approach used in processing profiles in the conventional assumption tables is time-consuming and is based on a generic profile. The conventional tools are also not flexible enough to allow for desired changes on a regular basis, making them time-consuming and unable to easily accommodate desired changes in real time.

SUMMARY

What is desired are systems and methods that provide dynamic, integrated assumptions to be ingested by a computer model in an efficient framework. One need is to create new assumption structures and to modify existing assumption structures using automated modeling techniques in lieu of conventional assumption tables. An additional need is for a tool that allows enterprise users to optimize variables used by the computer model in order to optimize performance efficiency. The embodiments described herein utilize simulation models rather than assumption tables, where the simulation models can be more easily adjusted. For example, the system can perform individual calculations for customers of a given product, then execute a simulation to determine a change in the overall status of the product, where that change can be readily adjusted to reflect current variables at an individual level.

The methods and systems discussed herein address the above-identified technical shortcomings by employing a suite of interdependent artificial intelligence models, which work together to automate and improve the flexibility, accuracy, and efficiency of mortality risk modeling and flow projections. The AI models discussed herein enable dynamic assumption structures, simulation-based models, and the reclassification of data based on user inputs, offering a solution to problems that arise in computer-specific modeling technology.

The methods and systems discussed herein significantly enhance the technology behind projections and mortality risk modeling by employing a suite of interdependent artificial intelligence models. Traditional tools rely heavily on static assumption tables and manual processes, which are slow and inefficient. The invention replaces these outdated methods with AI models that automate the creation and modification of assumption structures, eliminating manual intervention. This leads to faster and more accurate adjustments, improving both the speed and precision of the modeling process. Moreover, the AI models work together, with the output of one model feeding into another, creating a more sophisticated and nuanced understanding of the data, which results in more accurate and reliable projections than traditional systems can provide.

Additionally, the methods and systems discussed herein introduce flexibility and adaptability by allowing users to input specific parameters, such as mortality classes, and rerun the entire model pipeline in real time. This level of adaptability is far superior to conventional systems, which struggle with adjusting to new data or changing assumptions. The shift from static assumption tables to AI-driven simulation models further improves accuracy and adaptability, enabling more precise forecasting. This automation not only streamlines the modeling process but also reduces computational inefficiencies, allowing for quicker and more resource-efficient projections.

In some aspects, the techniques described herein relate to a system for using a suite of interdependent artificial intelligence models to improve each individual model's efficiency, the system including: a non-transitory computer-readable medium storing a computer program instructions, and a processor coupled to the non-transitory computer-readable medium and configured to execute the instructions to: in response to receiving a plurality of projection assumption inputs from a user device, execute a population builder machine learning model to: predict a dynamic adjustment table in accordance with the assumption inputs, and output a value population file representing a simulated population by applying the population builder model to population data, wherein the value population file includes a set of value cells representing instances of a product, the simulated population corresponding to a subset of a population selected in accordance with the dynamic adjustment table predicted by the population builder machine learning model; execute a morality machine learning model to determine mortality data for the product by ingesting the value population file generated by the population builder machine learning model; and execute a flow projection model to output for display at the user device a projection report for the product by applying the flow projection model to the mortality data ingested from the mortality machine learning model in addition to projection assumptions data based on the plurality of projection assumption inputs, wherein the projection assumptions data represent assumptions for the flow projection model; and generate a product file comprising code that represent the product and the projection report.

In some aspects, the techniques described herein relate to a system, wherein the processor is further configured to execute the instructions to: generate the population data in response to receiving a plurality of population inputs from the user device, wherein the population data represent value cell specifications associated with the product.

In some aspects, the techniques described herein relate to a system, wherein the population data include a plurality of cell keys, wherein respective cell keys index one or more of the value cell specifications to cell identities in the population data.

In some aspects, the techniques described herein relate to a system, wherein the projection assumptions data includes valuation parameters associated with the flow projection model.

In some aspects, the techniques described herein relate to a system, wherein the valuation parameters include decrement parameters representative of mortality and lapse decrements.

In some aspects, the techniques described herein relate to a system, wherein the projection assumptions data include product features and market scenarios.

In some aspects, the techniques described herein relate to a system, wherein the set of value cells represent inforce instances of the product, and the set of value cells include weightings of respective pricing cells in the simulated population.

In some aspects, the techniques described herein relate to a system, wherein the mortality data for the product include adjusted mortality variables including population based mortality adjustments based on the simulated value population.

In some aspects, the techniques described herein relate to a system, wherein the adjusted mortality variables include adjusted mortality tables including population based table adjustment surfaces determined via analysis of the value population file.

In some aspects, the techniques described herein relate to a system, wherein the flow projection model is communicatively coupled with the machine learning model via a call-response interface that handles API calls from the flow projection model and responses from the machine learning model.

In some aspects, the techniques described herein relate to a system, wherein the processor is further configured to execute the instructions to: train the machine learning model by applying survival modeling to a plurality of historical application records.

In some aspects, the techniques described herein relate to a system, wherein the processor is further configured to execute the instructions to: execute the machine learning model to generate value prediction data representative of one or both of a placement rate and a premium persistency rate; and execute the flow projection model to output the projection report by applying the flow projection model to the value prediction data.

In some aspects, the techniques described herein relate to a system, wherein the flow projection model is further configured to execute a profitability solver, wherein the projection report includes profitability data.

In some aspects, the techniques described herein relate to a method for using a suite of interdependent artificial intelligence models to improve each individual model's efficiency, the method including: receiving, by at least one processor, a plurality of projection assumption inputs from a user device; executing, by the at least one processor, a population builder machine learning model to: predict a dynamic adjustment table in accordance with the assumption inputs, and output a value population file representing a simulated population by applying the population builder model to population data, wherein the value population file includes a set of value cells representing instances of a product, the simulated population corresponding to a subset of a population selected in accordance with the dynamic adjustment table predicted by the population builder machine learning model; executing, by the processor, a morality machine learning model to determine mortality data for the product by ingesting the value population file generated by the population builder machine learning model; and executing, by the processor, a flow projection model to output for display at the user device a projection report for the product by applying the flow projection model to the mortality data ingested from the mortality machine learning model in addition to projection assumptions data based on the plurality of projection assumption inputs, wherein the projection assumptions data represent assumptions for the flow projection model; and generating, by the at least one processor, a product file comprising code that represent the product and the projection report.

In some aspects, the techniques described herein relate to a method, further including: generating, by the processor, the population data in response to receiving a plurality of population inputs from the user device, wherein the population data represent value cell specifications associated with the product.

In some aspects, the techniques described herein relate to a method, wherein the population data include a plurality of cell keys, wherein respective cell keys index one or more of the value cell specifications to cell identities in the population data.

In some aspects, the techniques described herein relate to a method, wherein the projection assumptions data includes valuation parameters associated with the flow projection model.

In some aspects, the techniques described herein relate to a method, wherein the valuation parameters include decrement parameters representative of mortality and lapse decrements.

In some aspects, the techniques described herein relate to a method, wherein the projection assumptions data include product features and market scenarios.

In some aspects, the techniques described herein relate to a method, wherein the set of value cells represent inforce instances of the product, and the set of value cells include weightings of respective pricing cells in the simulated population.

Other objects, features, and advantages of the present disclosure will become apparent with reference to the drawings and detailed description of the illustrative embodiments that follow.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure.

FIGS. 2A and 2B are partial views on two sheets, intended to form one complete view. FIG. 2A shows an upper portion of the schematic diagram of a cash flow engine for an actuarial projection tool, and FIG. 2B shows a lower portion of the schematic diagram of a cash flow engine for an actuarial projection tool.

DETAILED DESCRIPTION

Figure 1:
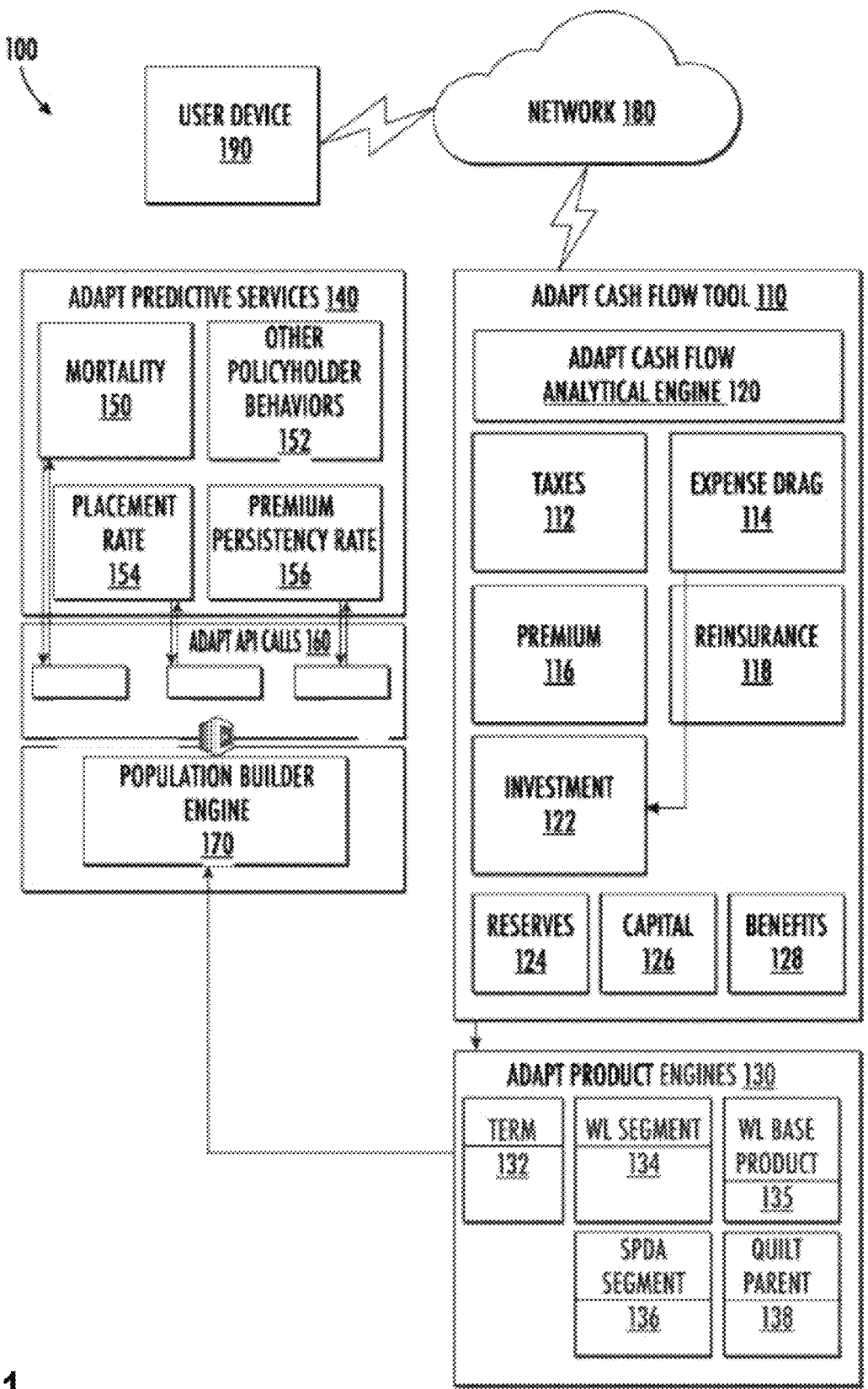
FIG. 1 is a system architecture for an actuarial projection tool, according to an embodiment.

In the following detailed description, reference is made to the accompanying drawings, which depict non-limiting, illustrative embodiments of the present disclosure. Other embodiments may be utilized and logical variations, e.g., structural and/or mechanical, may be implemented without departing from the scope of the present disclosure. To avoid unnecessary detail, certain information, items, or details known to those skilled in the art may be omitted from the following.

A life insurance policy is an agreement between a policyholder and an insurer whereby the insurer agrees to pay beneficiaries a sum of money at the time of the policyholder's death. In return, the policyholder pays premiums over a pre-defined period of time. Traditionally, most types of life insurance require an estimate of the expected lifetime of an individual at the time of application, commonly called the mortality risk. Conventional protocols for collecting and analyzing data that describes mortality risk are known as underwriting.

Although insurance companies do not intend to charge their customers excessively high rates, it is not prudent for them to charge all their policyholders the same premium. Underwriting enables the company to decline coverage to certain applicants, and to charge the remaining applicants premiums and to provide other policy terms that are commensurate with their level of risk. Actuaries compute the cost of covering mortality risk over the lifetime of the policy and translate it into a set of premium payments required throughout a policy's term. In typical practice, the financial risk and general approval of the underwriting process are agreed upon with reinsurance companies, institutions that assume a portion of the risk and that diversify their holdings across insurance industries.

Life insurance risk assessment has primarily consisted of point systems developed by medical doctors and experienced underwriters. Such protocols commonly calculate risk by mapping medical and behavioral attributes—such as cholesterol, build, driving record, and family and personal medical history—to point values that either debit or credit an overall score. This approach resembles risk calculations employed in clinical medicine. A life underwriter reviews an application to calculate the net number of points, assigning one of several risk classes that determine premium and are priced according to aggregate mortality.

Traditionally, underwriting has been a manual process. Underwriting can involve numerous people including agents and doctors, and it can be very time-consuming. Various entities have developed predictive modeling systems and methods to automate the underwriting process in order to improve decision-making, reduce the number of people involved, and accelerate the underwriting process. Predictive modeling in the survival context-herein called survival modeling-approximates a survival function that describes the probability that an event, occurring at random variable time T, occurs later than some given time t. The hazard rate is the rate of the event at time t conditioned on having survived until time t. In actuarial science, the hazard is often denoted as u and describes the mortality rate for a given attained age. The cumulative hazard function is the integral of the hazard function, and can be interpreted as the probability of failure at time t given survival until time t. The primary goal of survival modeling is to develop estimates of the survival, hazard, or cumulative hazard functions with respect to a set of observed covariates. In underwriting for mortality, the covariates are medical and behavioral attributes of life insurance applicants and the event is mortality.

Actuarial modeling including pricing and cash flow simulations require assumptions about expected mortality rates. In existing or conventional approaches, these expected mortality rates have been derived from a combination of observed mortality experience within a company and industrywide life tables. The Society of Actuaries publishes a series of Valuation Basic Tables (VBTs) that aggregate mortality experience within the insured population across many carriers. The most recent VBTs, published in 2015, compile data from numerous life insurers and facet mortality rates by standard factors, i.e., age, gender, duration, and smoking status.

Existing or conventional approaches and/or tools often use VBTs as a standard baseline because they reflect a much larger population than that of a single carrier. Actuaries compare observed mortality experience against the expected mortality rates in the VBTs using a metric referred to as the actual-to-expected (A/E) ratio. The A/E ratio is computed by summing all observed deaths divided by the accumulated hazard corresponding to each individual policy year on record. When the A/E is less than 100%, this indicates that the actual mortality experience is better than expected.

The system and method of the present disclosure employs an actuarial projection tool in lieu of conventional VBTs in actuarial modeling. In various embodiments, the actuarial projection tool enables a user to define criteria for an insurance product, such as thresholds for health and behavioral attributes, and determines how the criteria would affect pricing and profitability of the insurance product. In embodiments, the system allows users to choose new rates for various risk classes, and to experiment with new risk classes. For example, in defining new risk classes users may set new thresholds for health and behavioral attributes. In an embodiment, the actuarial projection tool provides a projection decrement rate curve for a given set of criteria passed in by the actuarial projection tool. In various embodiments, user inputs and user outputs of the actuarial projection tool can be employed in designing new insurance products, and in pricing these products.

In various embodiments, the actuarial projection tool can successively execute a series of models that cooperate to generate and display an actuarial projection report for an insurance product at a user device. A system incorporates a non-transitory computer-readable medium that stores computer program instructions, and a processor configured to execute the instructions. The system executes a population builder model to output a pricing population file representing a simulated pricing population by applying the population builder model to policy census data. The pricing population file includes a set of pricing cells representing instances of an insurance product. The system executes an algorithmic machine learning model to determine mortality risk data for the insurance product by applying the algorithmic machine learning model to the pricing population file. The system executes a cash flow projection model to output an actuarial projection report for the insurance product for display at a user device by applying the cash flow projection model to projection assumptions data and the mortality risk data.

In various embodiments, the actuarial projection tool receives inputs to the series of models from a user device. In an embodiment, the processor is configured to execute generate the projection assumptions data in response to receiving a plurality of projection assumption inputs from the user device, wherein the projection assumptions data represent assumptions for the cash flow projection model. In an embodiment, the processor is configured to generate the policy census data in response to receiving a plurality of policy census inputs from the user device, wherein the policy census data represent pricing cell specifications associated with the insurance product.

In an embodiment, the actuarial projection tool incorporates a cash flow engine that integrates various data science predictions such as mortality events (pay-out of death benefits), collection of premiums, customer lapses, etc. and that outputs a monetary value of cash flow. In the present disclosure, the actuarial projection tool is sometimes referred to as the cash flow model with reference to its cash flow engine.

In an embodiment, a sponsoring enterprise for the actuarial projection tool is an insurance company or other financial services company, which may be represented by insurance agents or advisors. In some cases, an insurance agent may be associated with only a single insurance provider (sometimes referred to as a "captive" insurance agent). In other cases, an "independent" insurance agent, sometimes called an insurance broker, may be associated with several different insurance providers.

In various embodiments, an actuarial projection tool integrates with predictive modeling components, also herein called "data science" models. In various embodiments, data science models that integrate with the actuarial projection tool include a mortality model, a placement rate model, and a premium persistence model (also herein called a lapse model). In an embodiment, the actuarial projection tool integrates with the predictive models via a call/response interface. In an embodiment, the call/response interface is configured to construct API requests to the data science models, determine if an API request is successful, and handle API responses from the data science models.

In various embodiments, the actuarial projection tool incorporates a population builder engine that simulates a pricing population, including mortality and placement, based on a user-specified applicant population and underwriting parameters. In an embodiment, the population builder engine generates a population-adjusted table. The population engine is also referred to herein as population builder model or population builder machine learning model.

In various embodiments, the mortality model operating in conjunction with the population builder engine provides various results to the cash flow model. In an embodiment, the mortality model outputs a quantitative risk score. In an embodiment, the quantitative risk score is a percentile. In an embodiment, the mortality model incorporates risk-class specific multiples to account for percentile bounds. In an embodiment, the system incorporates wear-off functions specific to given risk classes and risk multiples. The wear-off functions grade risk class of the population-adjusted table over time.

FIG. 1 shows a system architecture for an actuarial projection tool 100 (also herein called actuarial projection system). The actuarial projection tool 100 incorporates a cash flow tool 110, which interfaces with predictive services 140 including a mortality model 150, a placement model 154, and a premium persistency model 156. Other major components of system 100 include a Product Engine 130 and a Population Builder Engine 170. The actuarial projection tool 100 is configured to run an actuarial projection on demand upon receiving user inputs for the projection from user device 190 via network 180. The actuarial projection tool 100 enables users to simulate a pricing population, including mortality and placement, based on a user-specified applicant population and underwriting parameters. The system allows users to provide different rates for the various risk classes, and to experiment with new risk classes. The actuarial projection tool 100 can help enterprise users, such as actuaries and other professionals, gain a higher level of understanding of how risk and pricing can be optimized.

In an embodiment, the actuarial projection tool 100 can generate new mortality tables with varying risk class offer rates, and allows end-users to specify their desired offer rates by updating the existing offer rates. The actuarial projection tool 100 accepts the user-specified rates as the inputs, re-assigns the mortality risk classes accordingly, re-runs the entire pipeline of model training and prediction, and outputs a new table of mortality rates.

The actuarial projection tool 100 may be hosted on one or more computers (or servers), and the one or more computers may include or be communicatively coupled to one or more databases including databases of a sponsoring entity and third party databases. The cash flow tool 110 incorporates a cash flow analytical engine 120, which can be executed by a server, one or more server computers, authorized client computing devices, smartphones, desktop computers, laptop computers, tablet computers, PDAs and other types of processor-controlled devices that receive, process, and/or transmit digital data. The cash flow analytical engine 120 can be implemented using a single-processor system including one processor, or a multi-processor system including any number of suitable processors that may be employed to provide for parallel and/or sequential execution of one or more portions of the techniques described herein. The cash flow analytical engine 120 performs these operations as a result of a central processing unit executing software instructions contained within a computer-readable medium, such as within memory. In one embodiment, the software instructions of the system are read into memory associated with the cash flow analytical engine 120 from another memory location, such as from a storage device, or from another computing device via communication interface. In this embodiment, the software instructions contained within memory instruct the cash flow analytical engine 120 to perform processes described below. Alternatively, hardwired circuitry may be used in place of, or in combination with, software instructions to implement the processes described herein. Thus, implementations described herein are not limited to any specific combinations of hardware circuitry and software.

The cash flow tool 110 is highly functional in a mortality system as it provides a way to translate mortality model results, placement and lapse predictions, and other modeling assumptions such as underwriting parameters and risk class definitions into potential cash flow. Based on user inputs to the actuarial projection tool 100, such as applicant population and underwriting parameters, cash flow modeling enables enterprise users to derive premium pricing projections and projections of various parameters impacting profitability. Cash flow tool 110 incorporates various tables with file formats that track various pricing and valuation parameters for each cell of an actuarial projection.

Premium table 116 models premium payments. In an embodiment, Premium table 116 includes premium tables for Current Premium and for Guaranteed Premium. The Current Premium table holds the premium rates that are currently applied to the policies, while the Guaranteed Premium table holds the maximum rates that are allowed on the policies by contract. In an embodiment, Premium table 116 includes a table for Net Reserve Premiums. As used in the present disclosure, Net Reserve Premium is the level of premium that would be charged annually for the premium paying period in order to pay its claims under assumptions used in calculating statutory reserve 124. Net Reserve Premium varies by product, issue age, and gender. In an embodiment, Premium table 116 builds in surrender charges for policy cancelation.

In an embodiment, Premium table 116 incorporates a standard file structure with fields including product (the name of the product that corresponds to the applicable set of assumptions and rates for the cell); basis (the expense assumption basis-Marginal vs Fully allocated); and various fields for attributes of each cell including: gender (gender of the cell); issue_age (issue age of the cell); uw_class (underwriting class of the cell-UP, SP, S); uw_channel (how the cell was underwritten); tobacco (tobacco status of the cell-NT, T); face_lower (lower bound of the face band, inclusive); face_upper (upper bound of the face band, exclusive); policy fee (policy fee in dollars); policy years (annual premium rate per unit of face for each policy).

In an embodiment, the cash flow tool 110 incorporated a file utility for pre-processing data ingested into Premium table 116. In an embodiment, the user specified paths to the desired current and guaranteed rate tables, which have the product, term, face_band, gender, uw_class, and issue_age fields. The user also specified premium rates per unit of face starting with the initial policy year, indexed to base 1. The file utility script translated the face band and underwriting information to formats recognized by the cash flow model 110, and reindexed the rates to base 0.

Taxes table 112 forecasts taxes. Expense table 114 calculates expenses. In an embodiment, the Expense table 114 includes various categories of expenses such as acquisition expenses; maintenance expenses; lapse expenses; and claim expenses. In an embodiment, the Taxes 112 and Expenses 114 include deferred acquisition costs (DAC). In an embodiment, the Expenses table 114 embodies a file format corresponding to that of the Premium table 116, and includes fields for various expense rates used in cash flow modeling. In an embodiment, expense rate fields include comm (expense rate per dollar of commission), prem (expense rate per dollar of premium), pol (expense rate per policy inforce), k-face (expense rate per unit of face inforce), and app (expense rate per application; used in modeling acquisition expenses).

The Investment table 122 models investment data such as dividends and interest rate income derived from funds on deposit, subject to Expenses Drags 114. The Benefits table 128 models payout profiles including death benefits and annuity payments. Various tables model capitalization of the sponsoring enterprise including the Reinsurance table 118, Capital table 126, and Reserves table 124. Reinsurance table 118 includes the name of each reinsurance partner, and various fields tracking the cession rates and allowances for each reinsurer cell. The Capital table 126 tracks accumulated earnings, and distributable earnings in view of minimum capital and surplus requirements.

Reserves table 124 tracks reserves, i.e., funds that the sponsoring enterprise sets aside to ensure it will have funds needed to cover future claims. As used in the present disclosure, a policy reserve is a reserve for which the insured event has not taken place. In an embodiment, components of a simple policy reserve are Present Value (PV) of expected future claims less PV of expected future premiums. In an embodiment, policy reserves include additional components such as PV of expected future expenses 114, PV of future additional benefits 128, Expense allowances, and PV under multiple interest rate scenarios 122. In an embodiment, Reserves table 124 tracks best estimate reserve. In the present disclosure, best estimate reserve reflects the sponsoring enterprise's internal analysis, e.g., components included in inflows and outflows, economic scenarios, and expected decrements. In an embodiment, the Reserves table 124 tracks statutory reserve. Statutory reserve is the reserve level required by regulators, which is typically more conservative than best estimate reserve. In an embodiment 260 (FIG. 2B), actuarial assumptions for statutory reserves are used to model Net Reserve Premiums.

In an embodiment, the cash flow modeling incorporates core decrements. In an embodiment, the cash flow tool 110 incorporates profitability solvers. In an embodiment, a profitability solver evaluates financial results of a given insurance product using a set of assumptions and specified profitability metric(s). In an embodiment, enterprise professionals employ enhanced profitability solvers in optimizing risk classes and designing product features such as riders and additional benefits. In an embodiment, the cash flow modeling incorporates interest flows. In an embodiment, the cash flow tool 110 includes discretization and interpolation algorithms for continuous-to-discrete conversion in predictive modeling. In an embodiment, these algorithms convert continuous-time transfer functions to discrete-time equivalents.

Figure 2A:
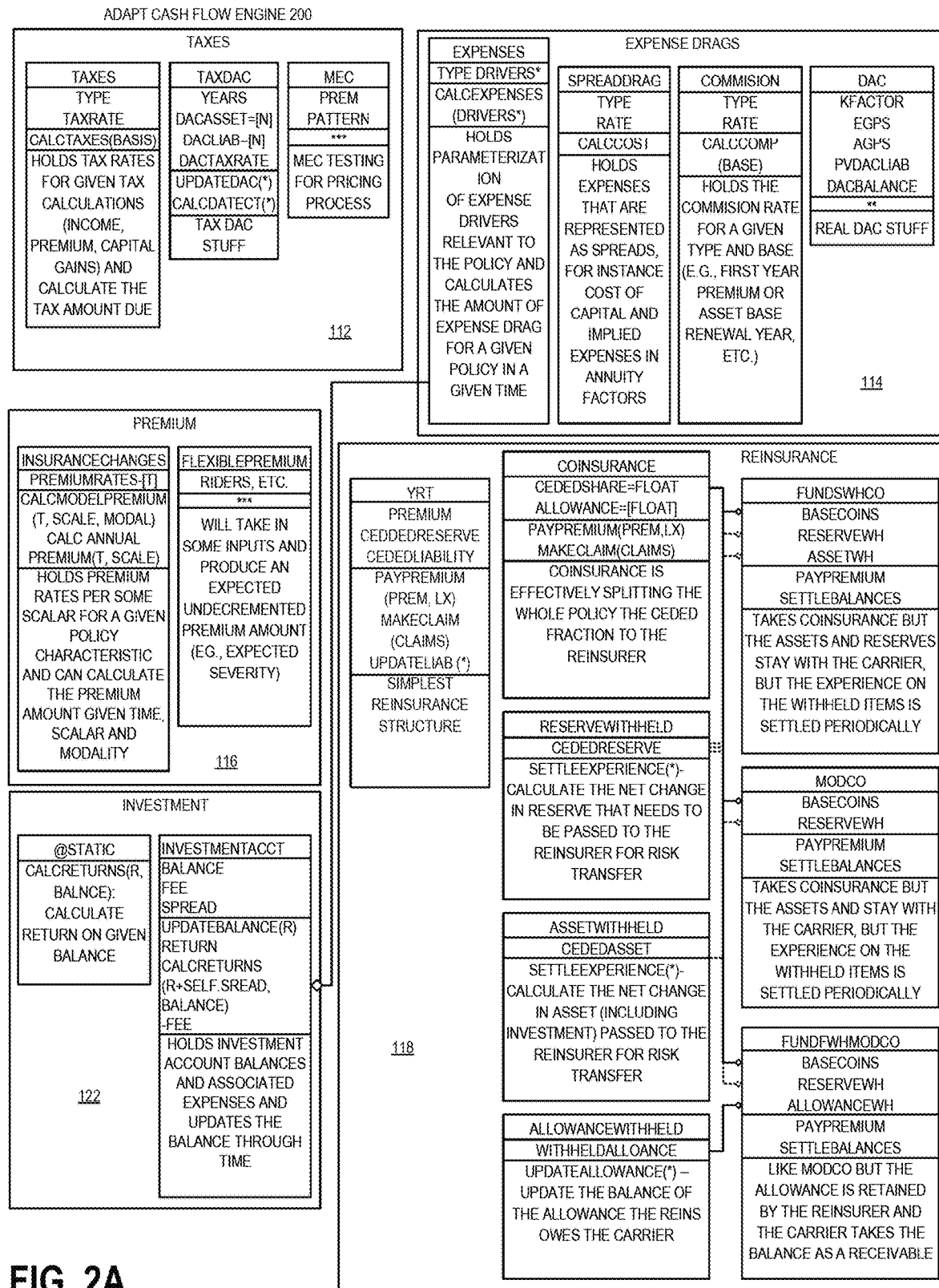
FIG. 2A is a first portion of a schematic diagram of a cash flow engine for an actuarial projection tool, according to an embodiment.
Figure 2B:
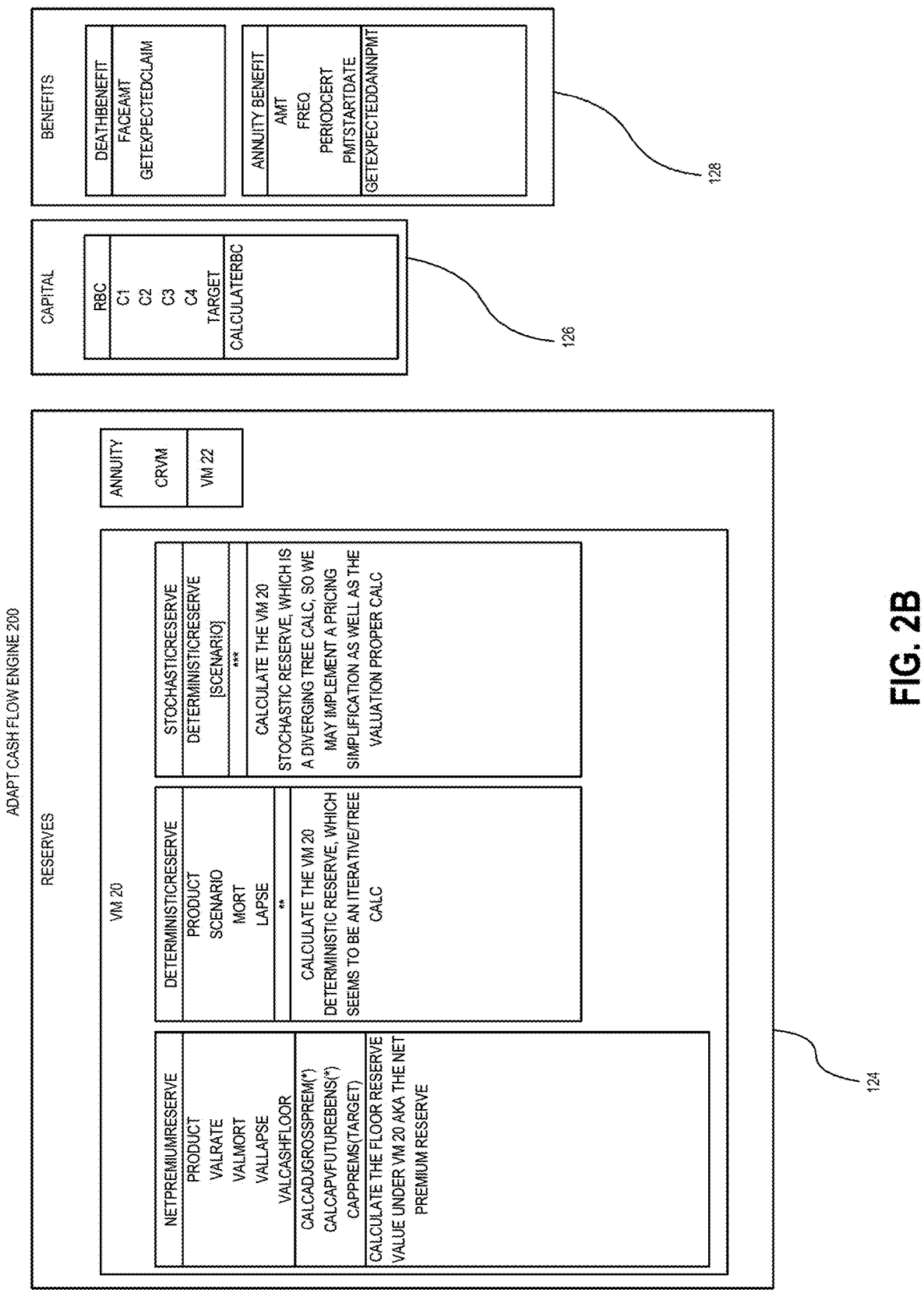
FIG. 2B is a second portion of a schematic diagram of a cash flow engine for an actuarial projection tool, according to an embodiment.

Components of the cash flow tool are shown in more detail in the cash flow system embodiment 200, viewed on two drawing sheets in FIGS. 2A, 2B. FIG. 2A shows an upper portion of a schematic diagram of components of cash flow engine 200, and FIG. 2B shows a lower portion of a schematic diagram of components of the cash flow engine 200.

In an embodiment, the actuarial projection tool incorporates Product Engines 130. When the cash flow tool 110 runs an actuarial projection, Product Engines 130 provide product features and assumptions for a selected life insurance product of the sponsoring enterprise. In an embodiment, Product Engines 130 include Term engine 132; Whole Life (WL) engines 134, 135; SPDA segment 136 (single premium deferred annuity), and Parent module 138.

Figure 3:
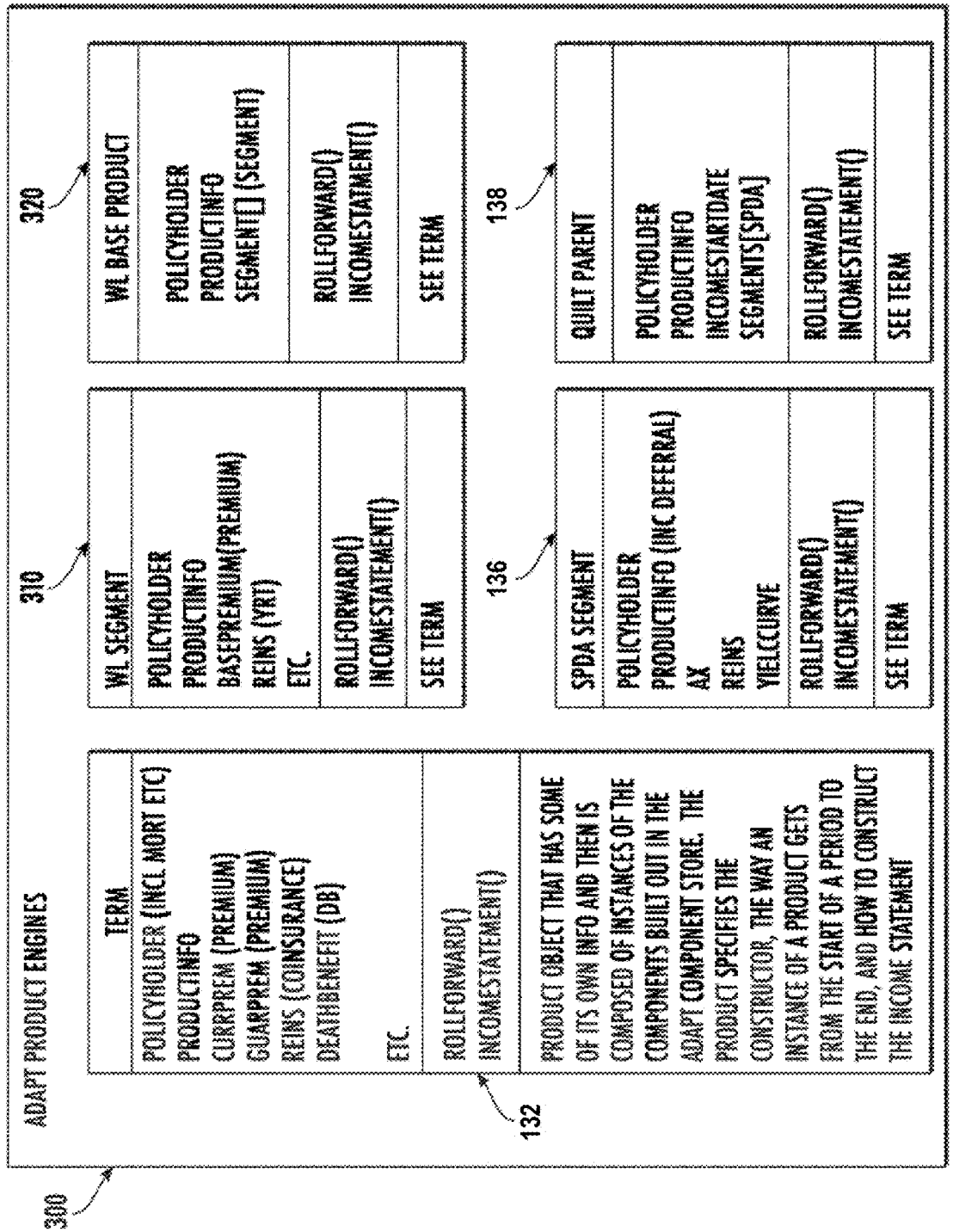
FIG. 3 is a schematic diagram of a product engine for an actuarial projection tool, according to an embodiment.

Components of the Product Engines 130 are shown in more detail in the embodiment 300 of FIG. 3. In an embodiment, whole life engines include WL Segment 310 and WL Base Product 320. In an embodiment, WL engines were reconciled to APL (Automatic Premium Loan) insurance provisions of the sponsoring enterprise. In an embodiment, WL engines were built with tabular reserves, cash value, and dividends. In an embodiment, WL engines build tabular reserves via cash flow modeling of outflows and inflows based on the actuarial formula:

$$_tV_x = PV_t(\text{outflow}) - PV_t(\text{inflow})$$

Predictive Services 140 comprise machine learning models that are trained on various sets of training data. Suitable machine learning model classes include, but are not limited to: random forests, logistic regression methods, support vector machines, gradient tree boosting methods, nearest neighbor methods, and Bayesian regression methods. In various embodiments, Predictive Services 140 include a Mortality model 150, a Placement Rate model 154, a Premium Persistency Rate model 156, and an Other Policyholder Behaviors model 152. In an embodiment, the Other Policyholder Behaviors model 152 models policyholder actions such as policy surrender and policy conversion.

Figure 4:
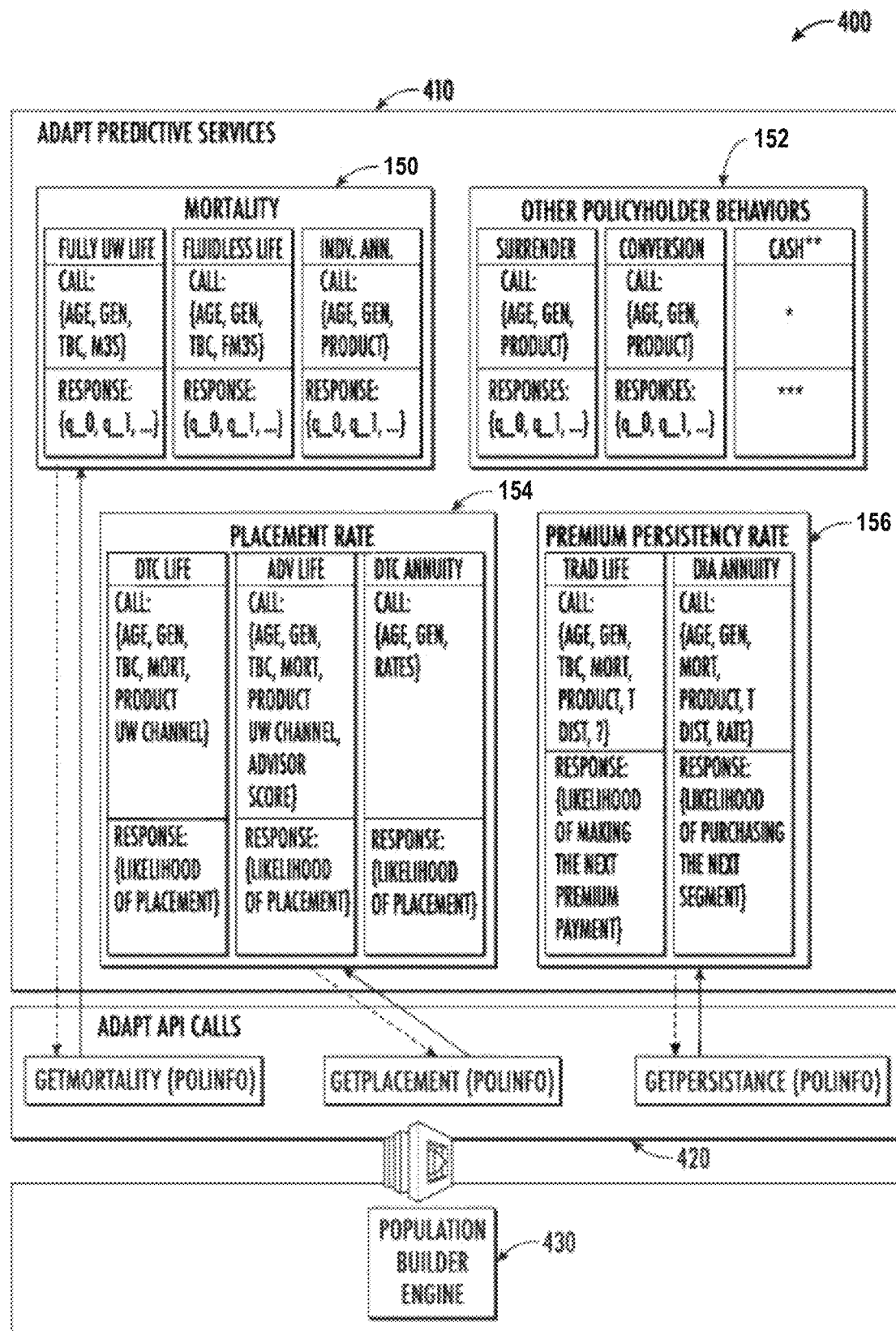
FIG. 4 is a schematic diagram of predictive services, API calls, and population builder engine for an actuarial projection tool, according to an embodiment.

Components of Predictive Services 140 are shown in more detail at 410 in FIG. 4. The embodiment 400 includes predictive services 410, API calls 420, and a population builder engine 430, also referred to herein as a population generator.

In various embodiments, the Mortality model 150 models mortality for a simulated pricing population based on a selected algorithmic underwriting protocol of the sponsoring enterprise. In one embodiment, the Mortality model 150 is based on a predictive machine learning underwriting protocol that includes medical data collected for the user in model covariates. In another embodiment, the Mortality model 150 is based on a predictive machine learning underwriting protocol that excludes medical data collected for the user from model covariates, herein sometimes called "fluidless" underwriting.

Premium Persistency Rate model 156 predicts policy persistency rates. As used in the present disclosure, policy persistency is the probability that the owner of a life insurance policy will choose to keep the policy in force by paying the premiums required as per the terms of the insurance contract. As used in the present disclosure, the Premium Persistency Rate model 156 is also called lapse model, and a policyholder who does not persist is said to have lapsed. In an embodiment, the Premium Persistency Rate model 156 calculates lapse rates using a tabular approach based on actuarial methodologies. In an embodiment, there are two components to the lapse assumption: a base table and a shock lapse rate. In an embodiment, the base table specifies the appropriate lapse rate for a given pricing cell by policy month. The shock lapse rate is based on the amount of the premium jump and the issue age for the applicable product.

In an embodiment, these shock lapse rates override the base lapse rates in applicable pricing cells.

In an embodiment, the Mortality model 150 and Premium Persistency Rate model 156 provide consolidated outputs to the cash flow tool 110 for a holistic view of how decrements impact profitability.

The Placement Rate model 154 predicts placement rates of insurance products. In an embodiment, placement means the initial purchase of an insurance product or the renewal of a previously purchased insurance product with an agent's participation or involvement. The Placement Rate model provides an objective prediction of the likelihood of customers taking an offered policy. In an embodiment, the Placement Rate model predicts an effect on placement rates due to a change in risk classes, such as an increase in placement rate associated with an offer of a preferred risk class. In an embodiment, the Placement Rate model predicts an effect on placement rates due to a change in underwriting parameters, such as an increase in placement rate associated with expedited underwriting procedures.

In an embodiment, Predictive Services 140 predicts customer lifetime value of customers of the sponsoring enterprise. Customer lifetime value is also called lifetime value (LTV) in the present disclosure. In various embodiments, lifetime value is a prediction of the net profit attributed to the entire future relationship with a given customer. Customer lifetime value represents an upper limit on spending to acquire new customers. In various embodiments, lifetime value also means the monetary value of a customer relationship, based on the present value of projected future cash flows from the customer relationship. In the systems and methods of the present disclosure, customer lifetime value can be a critical metric for actuarial projections of cash flow, in addition to mortality modeling outcomes.

In various embodiments, lifetime value includes the sum of all associated costs over product lifetime, netted against revenue for the product sale. The lifetime value for the product (insurance policy) sold to that customer is the net value of all premiums paid, over the sum of all such associated costs during that policy life. In an illustrative embodiment involving sale of an insurance policy, associated costs over product lifetime include various sales acquisition costs, including marketing costs, commission at the time of sale, and additional associated costs. In this example, additional associated costs include cost of providing the insurance policy, and claims or death benefit.

In various embodiments, total costs for a customer are modeled based on the customer's age, gender, policy face amount, and whether the policy is lapsed, and by applying formulas based on amortization of total marketing costs and operations costs. In an illustrative embodiment involving the sale of an insurance policy, total revenue for a customer is modeled based on the customer's age, gender, policy face amount, and whether the policy is lapsed (if so, when). The model calculates expected total premium payments based on age and gender via lookup of mortality statistics.

Figure 5:
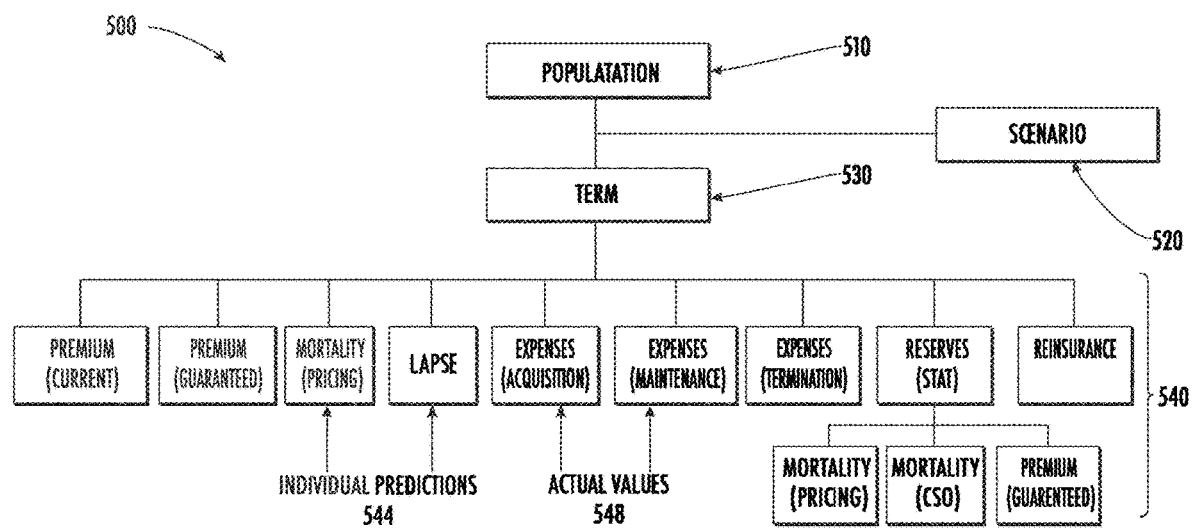
FIG. 5 is a hierarchy chart of a framework for constructing a given financial product via financial projections generated by an actuarial projection tool, according to an embodiment.

FIG. 5 shows a hierarchy chart of a framework for constructing a given financial product via financial projections generated by the actuarial projection tool of the present disclosure. Elements of the predictive model 500 include population 510, scenario 520, product 530, and variables 540. In an embodiment, the scenario 520 contains a set of inflation and discount rates to be applied within the predictive model 500 to discount cash flows and to inflate expenses, respectively. In the exemplary embodiment, the financial product 530 is a term life insurance policy. The actuarial projection tool replaces generalized assumptions with variables 540 that include individualized model predictions 544 such as mortality and lapse predictions; and actuals 548, e.g., historical expenses such as acquisition costs and maintenance costs.

Actuaries employ mortality experience studies to build mortality assumptions that drive pricing, reserving, asset-liability management, and dividends. In mortality experience studies, a mortality rate is calculated for each cell. As used in the present disclosure, a cell (also called pricing cell in the present disclosure) is a pricing unit, which is defined by a subset of the attributes for the population under study. Each cell corresponds to an interval of time that matches an experience rate interval. For example, if annual rates are to be calculated, separate cells are needed for each year in the study period (observation period). In various embodiments, an experience study is composed of data collected during a selected period of time for each cell. In an embodiment, a cell is a combination of issue age, sex, smoker/nonsmoker, and duration.

In an embodiment of development of mortality assumptions based on experience study data, mortality assumptions include a base mortality table {q_base} for all the pricing cells, and a set of multiples that applies to standard underwriting risk classes. In an embodiment of mortality assumptions in a company model for the sponsoring enterprise, five standard risk classes include 3 non-tobacco classes: UPNT, SPNT, NT, and 2 tobacco classes: SPT, and T. In an example of mortality assumptions, the multiples for UPNT Females and Males were 0.66 and 0.74 respectively, indicating that the mortality rates are calculated as q_base*0.66 and q_base*0.74 for UPNT females and males respectively.

In an embodiment, the actuarial projection tool incorporates a population builder engine 170. In various embodiments, the Mortality model 150 models mortality for a synthetic, model-assigned pricing population built by the population builder engine 170. In an embodiment, the Population Builder Engine 170 simulates a pool of placed policies. In an embodiment, these modules 150, 170 are configured to automate mortality tables generation for a given product under any user-specified risk class distributions. In various embodiments, the Population Builder Engine 170 receives inputs including an underlying population; distribution of risk factors (age, gender, smoking/non-smoking, and optionally face amount); underwriting program parameters; product data for a selected product; and other assumptions. In various embodiments, the Population Builder Engine 170 builds a simulated pricing population comprised of pricing cell permutations. In an embodiment, the Population Builder Engine 170 returns a collection of pricing cell instances of the given life insurance product, including predictive assumptions and weightings indicating how much of each pricing cell is represented in the simulated pricing population.

In various embodiments, the machine learning underwriting protocols 150 of the present disclosure require collection of body fluids and various physical measurements, and include clinical assessments in the data that describes mortality risk factors. As used in the present disclosure, a "medical risk factor" is any variable associated with a health outcome or state, such as a risk of disease, infection and/or health-related event, e.g., a stroke, diabetes, heart attack, cancer and death. Medical risk factors may be correlated with a health outcome or state and may, or may not, have a causal relationship with a health outcome or state. In the present disclosure, risk factors derived from collection and analysis of body fluids and various biophysical measurements are sometimes called "clinical assessment risk factors" or alternatively "clinical assessments," and the collected medical data for these clinical assessments (e.g., body fluids and biophysical measurements) are sometimes called "clinical data," or alternatively "clinical laboratory data." As used in the present disclosure, underwriting protocol embodiments that incorporate clinical data in the application received from the user and in medical data collected for the user are sometimes called "clinical" (e.g., clinical underwriting, clinical application). In various embodiments, clinical underwriting protocols of the present disclosure implement additive feature attribution for interpretability of a mortality score. In the present disclosure, a clinical machine learning model and the mortality score output by that model, are sometimes called the mortality score model.

Clinical data collected in medical examinations in support of conventional applications for life insurance are typically employed to assess the applicant's health, to confirm information included in the application, and to screen for illegal drug use. Much of the collected clinical data is also obtained from other sources during the application process, and clinical test results and answers to examination questions are typically checked for consistency with the other sources.

Clinical assessments based on collected blood and urine samples typically test the collected fluids to screen for dozens of indicators of diseases and conditions (health indicators). Examples of clinical assessment risk factors include HIV and AIDS; sexually transmitted diseases (STD); cholesterol, (including LDL and HDL) and triglycerides (e.g., as indicators of heart disease risk factors); hemoglobin A1C, fructosamine and glucose levels (e.g., as indicators of diabetes); creatinine, hemoglobin and proteins (e.g., as indicators of kidney disease); and urine acidity (e.g., as indicator of impaired kidney function or diabetes). Typical medical examinations also screen for nicotine and cotinine in the urinalysis in order to determine tobacco usage. Additionally, clinical assessments may include biophysical examinations such as weighing the applicant and questioning the applicant, e.g., about lifestyle.

In other embodiments, an expedited underwriting protocol eliminates this clinical data, and omits the analysis of clinical assessment risk factors. Applicant has observed that the expedited underwriting protocol can improve customer experience with faster processing and reduced customer burdens of providing information required by the underwriting process. In the present disclosure, an underwriting protocol that omits clinical data from the application received from the user and that omits the requirement of collecting medical data from the applicant is sometimes called "fluidless" (e.g., fluidless underwriting, fluidless application).

In various embodiments, in lieu of clinical assessments as inputs to mortality predictions, the fluidless underwriting embodiments of the present disclosure employ a mortality predictive model trained using data from a large corpus of historical applications based on traditional underwriting protocols, in conjunction with public data sources that can provide a holistic view of prospective customers. In various embodiments, the system and methods of the present disclosure receive applications of prospective customers that exclude clinical data, and apply fluidless mortality predictive modeling to determine whether to approve sale to the applicant of a risk-pooling product, such as life insurance. The fluidless machine learning model suite with model interpretability is sometimes herein called a fluidless mortality score model.

Figure 7:
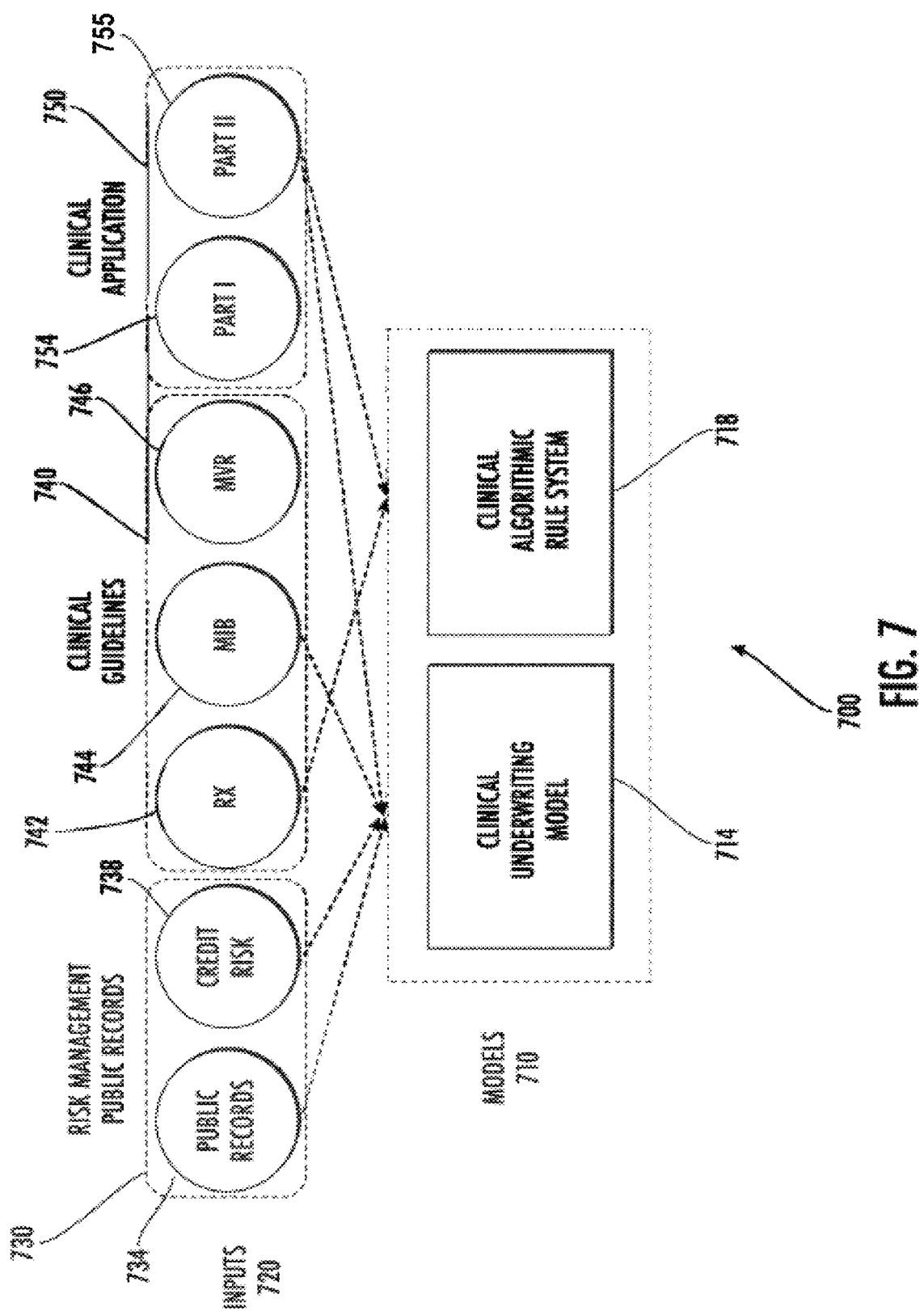
FIG. 7 is a schematic diagram of input data sources and models of a clinical underwriting method, according to an embodiment.
Figure 8:
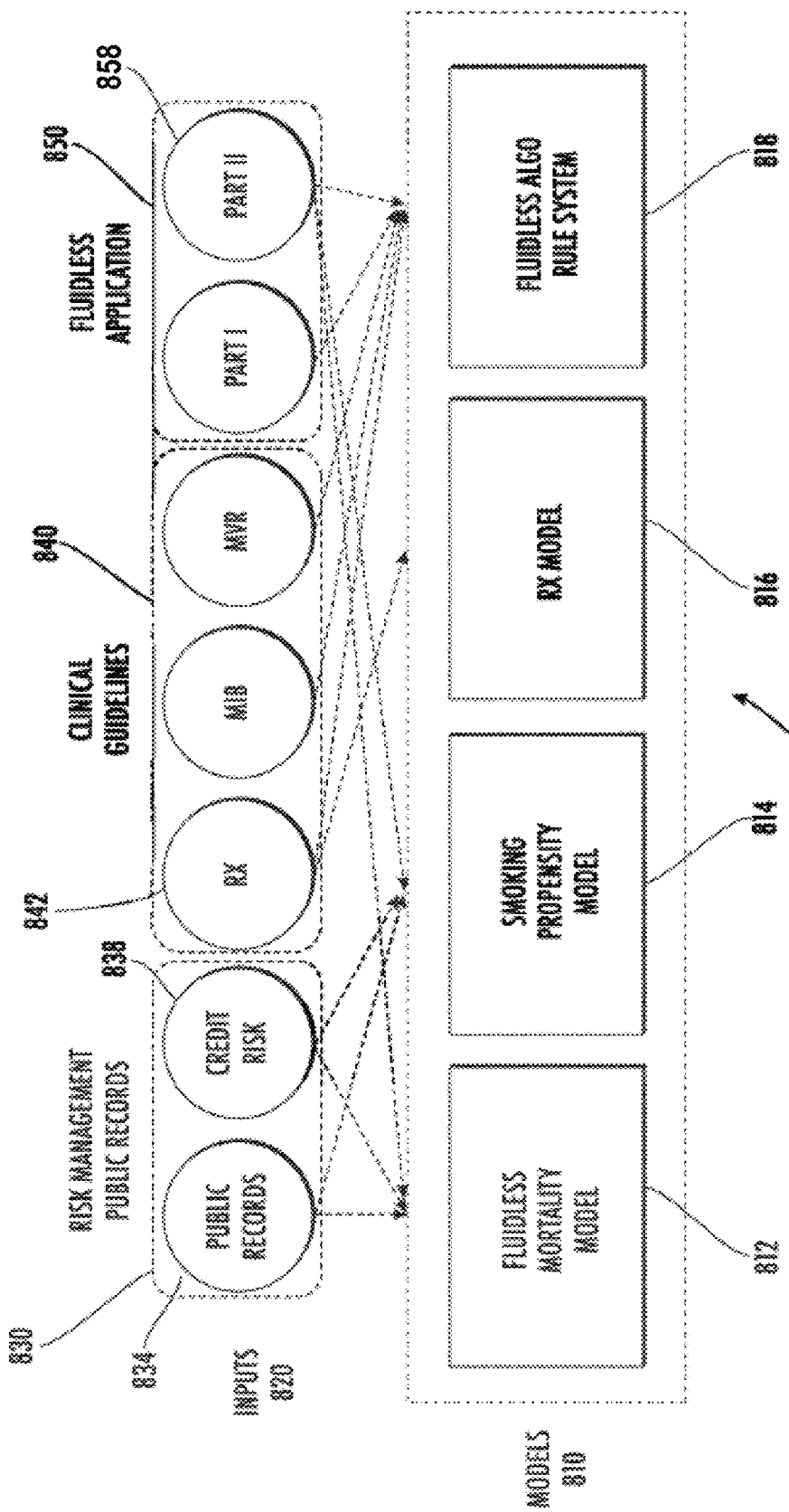
FIG. 8 is a schematic diagram of input data sources and models of a fluidless underwriting method, according to an embodiment.

In various embodiments, mortality predictive model 150 may include one or more machine learning underwriting models, such as one or more of a clinical underwriting model (e.g., the clinical underwriting model 714, FIG. 7), and a fluidless underwriting model (e.g., the fluidless underwriting model suite 810, FIG. 8).

Figure 6:
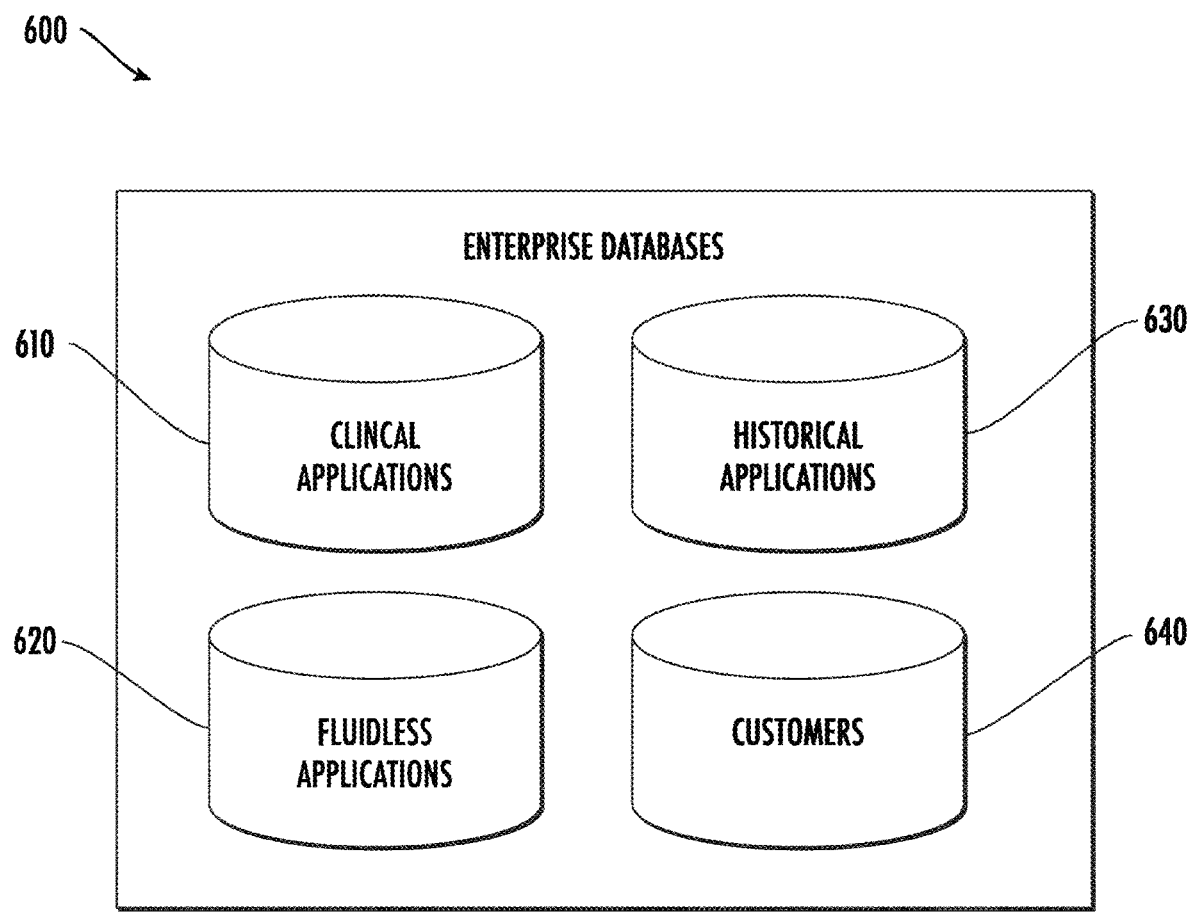
FIG. 6 illustrates enterprise databases for an actuarial projection tool, according to an embodiment.

In various embodiments, the actuarial projection tool 100 incorporates various databases under custody of a sponsoring enterprise including financial databases of the cash flow tool 110, product databases of the product engine 130, and enterprise databases 600. In the embodiment of FIG. 6, enterprise databases 600 include a clinical applications database 610, a fluidless applications database 620, a historical applications database 630, and a customer database 640. Electronic applications for clinical underwriting (as shown in FIG. 7) are stored in the clinical applications database 610. Electronic applications for fluidless underwriting (as shown in FIG. 8) are stored in the fluidless applications database 620. Alternatively, these underwriting application data are received via paper application and is digitized for storage. In an embodiment, in model training of machine learning predictive models, the clinical underwriting model 714 and the fluidless underwriting model suite 810 were each built from historical applications of the sponsoring enterprise containing 1.3 MM records, stored in the historical applications database 630. The Customer database 640 tracks individuals who are customers of the sponsoring enterprise. In an embodiment, the customer database 640 stores customer total lifetime values determined for respective customers of the sponsoring enterprise.

Databases are organized collections of data, stored in non-transitory machine-readable storage. In an embodiment, the databases may execute or may be managed by database management systems (DBMS), which may be computer software applications that interact with users, other applications, and the database itself, to capture (e.g., store data, update data) and analyze data (e.g., query data, execute data analysis algorithms). In some cases, the DBMS may execute or facilitate the definition, creation, querying, updating, and/or administration of databases. The databases may conform to a well-known structural representational model, such as relational databases, object-oriented databases, and network databases. Database management systems include MySQL, PostgreSQL, SQLite, Microsoft SQL Server, Microsoft Access, Oracle, SAP, dBASE, FoxPro, IBM DB2, LibreOffice Base, FileMaker Pro. Database management systems also include NoSQL databases, i.e., non-relational or distributed databases that encompass various categories: key-value stores, document databases, wide-column databases, and graph databases.

FIG. 7 shows a simplified schematic of a system 700 for evaluating program-eligible applicants for approval to receive a clinical underwriting offer. The system 700 requests inputs 720 from various third party API's and receives clinical digital applications of the sponsoring enterprise. The system 700 tests inputs 720 via clinical underwriting models 710 in order to determine whether to present an underwriting offer to the applicant, and the terms of such offer.

The system 700 acquires data from three traditional underwriting sources, Clinical Applications Part I 754, client medical interviews ("CMI"; application part II 755), and prescription drug histories (Rx data 742). Unlike a fluidless underwriting system, which omits the requirement that the user submit clinical data in the application (Clinical Applications Part I 754), the clinical underwriting 700 requires that data. In various embodiments, data sources of the system 700 may include one or more nontraditional underwriting sources-public records 734 and credit risk data 738, MIB data 744 and MVR data 746. In that event these non-traditional data sources are not used as a substitute for clinical assessment risk factors and do not eliminate the need to submit clinical laboratory data.

In an embodiment, the Clinical Underwriting Model 714 predicts mortality risk of a given individual relative to the individual's age and sex cohort, based on clinical assessment risk factors as well as other medical risk factors.

A Clinical Algorithmic Rule System 718 stores and applies rules that reflect a comprehensive set of medical and underwriting guidelines developed by experts in underwriting and insurance medicine, including rules based on clinical laboratory data. Each rule determines the best available risk class in the presence of certain values in the application. The Clinical Algorithmic Rule System 718 executes all rules across data retrieved from various data sources 720.

In various embodiments, the Clinical Algorithmic Rule System 718 in conjunction with Clinical Underwriting Model 714 determine a risk score and risk percentile for the applicant, and assigns the applicant to a risk class.

FIG. 8 shows a simplified schematic of a system 800 for evaluating program-eligible applicants for approval to receive a fluidless underwriting offer. In an embodiment, the system 800 acquires data from four primary data sources as inputs to a fluidless machine learning underwriting model suite 810. Data sources of the system 800 include two nontraditional underwriting sources, public records 834 and credit risk data 838, and two traditional underwriting sources, client medical interviews ("CMI"; application part II 855) and prescription drug histories (Rx data 842). As used in the present disclosure, the generic term "public data" denotes data relating to applicants of the enterprise obtained from one or more third party sources, and encompasses both "public records" and "credit risk data."

The system 800 requests inputs 820 from various third party API's 830, 840 and receives fluidless digital applications of the sponsoring enterprise. The client medical interview data set 855 consists of an extensive questionnaire filled out by life insurance applicants. This digital questionnaire covers personal and family health history, as well as behavioral questions related to motor vehicle violations, smoking, and related topics.

The system 800 tests inputs 820 across a set of fluidless models 810 of the enterprise in order to determine whether to present an accelerated underwriting offer to the applicant. Models 810 include a comprehensive algorithmic rule system 818 and three probabilistic models 812, 814, 816. In an embodiment, the Fluidless Mortality Model 812 predicts mortality risk of a given individual relative to the individual's age and sex cohort without use of clinical data. A Smoking Propensity Model 814 addresses a challenge of the fluidless underwriting protocol, that actual knowledge of an individual's tobacco usage is a central factor in assessing mortality risk. Rather than rely solely on self-reporting of tobacco usage, the fluidless modeling suite includes a Smoking Propensity Model 814 that specifically predicts tobacco usage. The Rx Model 816 predicts the probability of declining accelerated underwriting offer or issuing a substandard offer conditioned on information derived from prescription drug fills. In an embodiment, the Fluidless Algorithmic Rule System 818 can "clear" an algorithmic rule if it identifies adequate cause to override information flagged by the system. In various embodiments, in order to receive approval for presentation of an accelerated underwriting offer, the application must pass all model components 812, 814, 816, and 818.

In various embodiments, the fluidless model suite 810 determines a risk score and risk percentile for the applicant, and assigns the applicant to a risk class.

In various embodiments, the mortality predictive model 150 provides several results to the cash flow engine of the actuarial projection tool 100. In an embodiment, the results include (a) population adjustments to base tables; (b) risk multiples; and (c) wear-off functions. In an embodiment, the mortality predictive model 150 outputs adjusted mortality risk variables for a life insurance product including population based mortality risk adjustments by applying the mortality predictive model to a simulated pricing population generated by population builder engine 430.

In an embodiment, population adjustments results (a) include population adjustment surfaces for Male/Female and Smoking/Non-Smoking factors to align VBT values with experience under a historical mortality model of the sponsoring enterprise. In an embodiment, risk multiples results (b) include risk class specific multiples to account for given percentile bounds of risk class in the mortality model, as well as issue age, gender, and smoker status. In an embodiment, wear-off functions results (c) include risk class/multiple specific wear off functions to grade the risk multiple of the population adjusted table over time.

In various embodiments feature (a), population adjustment surfaces, for each of the four VBT tables (M-NT/F-NT/M-T/F-T) adjustments are made to VBT issue age and duration mortality tables to better align with experience under a historical mortality model of the sponsoring enterprise. In existing methods, these multiples have been derived by taking A/E ratios between the base VBT tables and underwriting experience and then using actuarial credibility and actuarial judgement, cohorting the population to optimize A/E while deriving factors with sufficient credibility. For example, all male non-smokers with issue ages under 65 and durations <25 may be cohorted together and would have the same population adjustment factor applied to their VBT base qx's.

In an embodiment, the system and method of the present disclosure create a customized set of population base table adjustment surfaces that align the population rates with historical experience. In an embodiment, these customized population surfaces leverage a high volume of data from historical mortality model to facet risk factor cohorts into sub-populations. In an embodiment, model training curated a data set on the scale of one million historical applications of the sponsoring enterprise. In an embodiment, the customized population surfaces additionally facet the cohorts by face amount. In an embodiment, these methods apply statistical optimization methods to cohort the population in a way that objectively optimizes credibility and homogeneity.

In an embodiment of the feature (b), risk class specific multiples, for each pricing cell or policy the cash flow model inforce file has a mortality model score percentile that indicates how the model would have scored this person today. The cash flow model identifies the appropriate risk class for the policy given risk class percentile bounds by age/gender/smoking cohort, and passes the percentile bounds and all other needed data to the mortality model 150. The mortality model then returns a risk multiplier for each risk class in the adjusted base table associated with the model. This approach permits dynamically adjusting underwriting class bounds, renders the interaction between cash flow and mortality model agnostic to the mortality model version, and provides a consistent approach to mortality in product pricing.

In an embodiment of the feature (c), risk class/multiple specific wear off functions represent an improvement over conventional actuarial methods that utilize inflexible risk multiples. For example, conventional risk multiples may be flat for 20 years, then grade linearly to 1 over the next 20 years. In various embodiments of risk class/multiple specific wear off functions, the shape and duration of the wear off pattern can vary by factors like issue age, initial health, gender, etc. In an embodiment, using wear-off durations specific to age/gender/smoking class or risk class, the risk multiples are passed in as a vector with time to return a specific parameterized function for the given policy. Another embodiment uses wear-off durations specific to age/gender/smoking class or risk class, in which the risk multiples employ specific parameters in an agreed functional form that specifies the risk multiple decay factor.

In an embodiment, the cash flow engine of the actuarial projection tool 100 interfaces with predictive services including the mortality model via a call/response interface, e.g., API calls. Various instances of a call/response interface for mortality model results are shown in Table 1.

TABLE 1

| Call-Response Interface for Actuarial Projection Tool (API Calls) | | |
|---|---|---|
| Mortality Model result | Cash Flow Model sends | Mortality Model returns |
| Base table adjustment surfaces | i. Projection start date<br>ii. Mortality model version | Panel of issue age x duration multiples for (M, F) x (NT, T) |
| "Policy" specific risk multiple | i. Issue age<br>ii. Gender<br>iii. Smoker status<br>iv. Mortality model risk class lower bound percentile, mortality model risk class lower bound percentile<br>v. Mortality model version | Multiple/vector of multiples that adjust the base table (post-population surface) for specific "policy" mortality |
| "Policy" risk multiple specific wear-off function | i. Risk multiple<br>ii. Wear off function functional form | Function or parameters for standard functional form to decay the risk multiple |

In various embodiments, calls to the mortality table are made at the start of a run, when the actuarial projection tool 100 is assembling the synthetic projection population. In an embodiment, API calls within the cash flow model projection implement the following timing: (a) Base Table Adjustments are applied during base table construction prior to inforce build; (b) Policy Specific Risk Multiple is requested during inforce build, before projection start, then is passed into a policy object constructor; (c) Wear-off Function parameters are requested during inforce build before projection start, then are passed into a policy object constructor.

In various embodiments, the mortality model 150 incorporates various assumptions adapted for integration with the cash flow tool 110. In an embodiment, the mortality model 150 includes the following improvements: (1) developing and incorporating pure mortality rate tables based on a study population including general applicants for life insurance; (2) replacing the conventional underwriting system (e.g., based on five risk classes) with predictive machine learning underwriting; and (3) building tools to automate mortality tables generation under any user-specified risk class distributions.

In an embodiment of improvement (1), the mortality model is developed based on mortality experiences of a study population of general applicants rather than just policies in force. This improvement enables actuaries to study the interactive effects of lapse/placement rates with mortality experiences. In an embodiment, the study population is based on a dataset that includes the vast majority of life insurance applicants from a fifteen-year historical period. While inforce studies only include experiences when coverage is active, this study includes the mortality experience of individuals who were not issued a policy (declined, not taken); and post-termination mortality experience of non-claim terminated policies (e.g. lapse, surrender, expiration). This study provides actuaries with an improved basis for projecting the mortality impact of lapse, placement rate, and other non-claim termination processes, which can have significant and often anti-selective effects on claim experience and profitability. See Example 1 below.

In an embodiment of improvement (2), replacing the conventional underwriting system (e.g., based on five risk classes) with predictive machine learning underwriting, the mortality model derives mortality tables resulting from the mortality predictive machine learning underwriting model. The mortality model-driven underwriting provides the risk assessment of historical applicants using current underwriting criteria, which overcomes the traditional studies' drawback of inconsistent underwriting criteria from different eras. The predictive mortality model generates high resolution risk scores that facilitate any level of risk class redistribution in the methods of the present disclosure for designing new insurance products and pricing these products. See Example 2 below.

In an embodiment, the method of the present disclosure builds death records for a study population of general applications via one or more third party source of public records. In an embodiment, public records include attributes that pertain to individual-level records that are filed by a public office, such as addresses, education, licenses, property, assets, and financial disclosures. The methods of the present disclosure overcome the problem of a mortality model based on a study population of general applicants whose death records collected through third party public records are often subject to a high level of missingness. In an embodiment, the general applicant dataset applies a method to correct for the underreporting bias. In an embodiment, this method measured the death underreporting rate in third party public records by comparing the number of claims on inforce experience to the number of third party death records on the same experience, and developed a model to correct for this underreporting. The corrective model predicted the rate and accounted for any variations with variables such as age at death and calendar year, and used this information to adjust the death counts in the third party public records. See Example 3 below.

Improvement (3), building tools to automate mortality tables generation under any user-specified risk class distributions, facilitates the important goal of assessing profitability in correspondence to changes in risk class distributions. These changes can include, for example, increasing/reducing volumes of certain risk classes, adding a new risk class, or removing an existing risk class. See Example 5 below.

In various embodiments, the user employs the cash flow tool 110 to generate a synthetic pricing distribution, also called synthetic inforce file in the present disclosure. In an embodiment, the cash flow tool 110 was implemented in the Python object-oriented programming language, https://www.python.org/. In setting up a given projection (also herein called a run), a user can select percentile bounds to use for the risk classes, or can choose the default historical rates. In an embodiment, if the user specifies a different set of risk class percentile bounds, the Python program calls an internal R object to rerun the mortality pipeline and output a new mortality table. If the user chooses the default historical rates, the Python program ingests a default mortality table from mortality training pipeline 150, as described in Example 6 below.

Example 1: Mortality model training data included all applicants for which a lab test was ordered during the time period of 2000-2014. The study population included nearly one million applications and 870K unique individuals. After removing applications with a high degree of missing values, typically from incomplete or withdrawn applications, the study population reduced to 908K applications with 9.16M exposure years.

Example 2: In selecting a dataset for the mortality model 150, a study population based on mortality model data was compared with experience data of the sponsoring enterprise from an observation period of 2010-2017. The mortality model study data was selected for various reasons. Risk stratification based on mortality model was assessed to be more closely aligned with current underwriting, as is desirable in modeling pricing. The mortality model provided an objective measurement of mortality risks. For historical applicants, the offer rates of different risk classes showed substantial variation over time, and risk classes reassignment using the mortality model can mitigate those variations. Additionally, the mortality model-based risk stratification can help assess how changes in risk class distributions may affect profitability. Such changes may include, for example, increasing or reducing volumes of certain risk classes, adding a new risk class, and removing an existing risk class.

Example 3: A model development method used propensity score (PS) weighting based on a logistic regression to calculate the underreporting rate in third party death records for different groups. At an initial stage, the method formed a training dataset of internal claims in the in-force population. The training dataset was then joined with the death record in public records data by SSN. A logistic regression model was fit with selected demographical variables X as covariates to predict the propensity score. The method estimated a propensity score by selecting all third party death cases in the early dropout population to form a new dataset. For each case in the new dataset, the propensity score $p_i$ was estimated using the previously derived logistic regression model.

At a bias correction stage, the method calculated weights for each case, defined as $w_i=1/p_i$. The weights were truncated at 10 in cases where $w_i>10$. The dataset added two columns "propensity" and "weight" to the mortality model data. For any death case in the early dropout population, the individual was assigned a propensity score and a weight was calculated as described above. For all other cases, the individual was assigned a weight of 1. In subsequent analyses, these weights were applied to all exposure calculations and death indicators.

Example 4: A model development method used Quasi-Poisson Generalized Additive Modeling (GAM) to develop data-driven adjustments of the base tables (2015 VBT), instead of applying flat multiples to the base tables on neighboring cohorts. Quasi-Poisson Generalized Additive Modeling (GAM) is also referred to in the present disclosure as Poisson Generalized Additive Modeling. GAM is essentially a generalization of Generalized Linear Modeling (GLM) in which the linear predictor is allowed to depend nonlinearly on continuous variables, such as age. GAM modeling represents an emerging best practice in experience studies. The GAM regression model was expressed as:

$$E[\text{actual}|\text{issue\_age,gender,duration,risk\_class}] = \text{expected}*\exp[\beta 0 + f(\text{issue\_age,gender,duration,smoker,risk\_class})]$$

The 2015 VBT was selected as the base mortality rate, dependent on issue_age, gender, duration and smoker status. Therefore, in the regression model:

$$\text{actual} = (\text{weight})*(\text{death indicator})$$

$$\text{expected} = (\text{weight})*(vbt\ \text{hazard})*(\text{length of exposure})$$

where weight=face_amount if benefit weighted; weight=1 otherwise. f(.) is expressed as:

$$\text{gender} + \text{risk\_class} + \text{gender} * s1(\text{issue\_age}) + \text{risk\_class} * s2(\text{issue\_age}) + \text{gender} * s3(\text{duration}) + 1(\text{risk\_class} > \text{subs/decl}) * s4(\text{duration})$$

where $s_1$, $s_2$, $s_3$, $s_4$ are smooth functions with up to 5 degrees of freedom. The predicted yearly mortality hazard from this model is given by:

$$\lambda = (vbt\ \text{hazard}) * \exp[\beta 0 + f(\text{issue\_age,gender,duration,smoker,risk\_class})]$$

Consequently, the yearly death probability q can be computed as:

$$q = 1 - \exp(-\lambda)$$

Example 5: An input interface of the tool allowed an end-user to specify desired offer rates by updating default offer rates displayed by the tool. The end-user would enter the desired rates in the same format as the default rates. The tool read the user-specified rates and screened the data to verify that various required conditions are satisfied. A first requirement was that for each age/gender cohort, all tobacco offer rates should sum up to 1, and all non-tobacco offer rates should sum up to 1. A second requirement was that any user specified substandard/declined rates should be no lower than the default substandard/declined rates.

Given the specified offer rates, the tool derived mortality model cutoffs by calculating the corresponding quantiles of the mortality model scores for each age/gender cohort. An example of mortality model cutoffs corresponding to the default rates for selected cohorts is shown below in Table 2.

TABLE 2

Mortality Model Cutoffs for selected Age/Gender Cohorts

| age_5 | gender | smoker | upnt_cutoff | spnt_cutoff | nt_cutoff | spt_cutoff | t_cutoff |
|---|---|---|---|---|---|---|---|
| 25 | F | NS | 0.029 | 0.042 | 0.075 | 0.063 | 0.107 |
| 25 | M | NS | 0.033 | 0.044 | 0.084 | 0.070 | 0.119 |

The tool then reassigned the mortality model risk classes based on cutoffs derived in the preceding step. For example, let M denote the mortality model score of a 25-year-old female non-smoker applicant. If M≤0.029, upnt is assigned; if 0.029<M≤0.042, spnt is assigned; if 0.042<M≤0.075, nt is assigned; if 0.075<M, substandard or declined is assigned.

Given the new risk class assignment, the tool re-trained GAM and re-generated the mortality table using the methods described in Example 4.

Example 6: The cash flow tool 110 was implemented in the Python object-oriented programming language. In an embodiment, cash flow analytical engine 120 transmitted the cash flow tool 110 and its dependencies via network 180 for installation on user device 190, creating a virtual environment and setting up Python objects locally. In another embodiment employing client-server architecture, cash flow analytical engine 120 hosted the cash flow tool 110 in communication with user device 190 without local set-up of Python objects.

Figure 9:
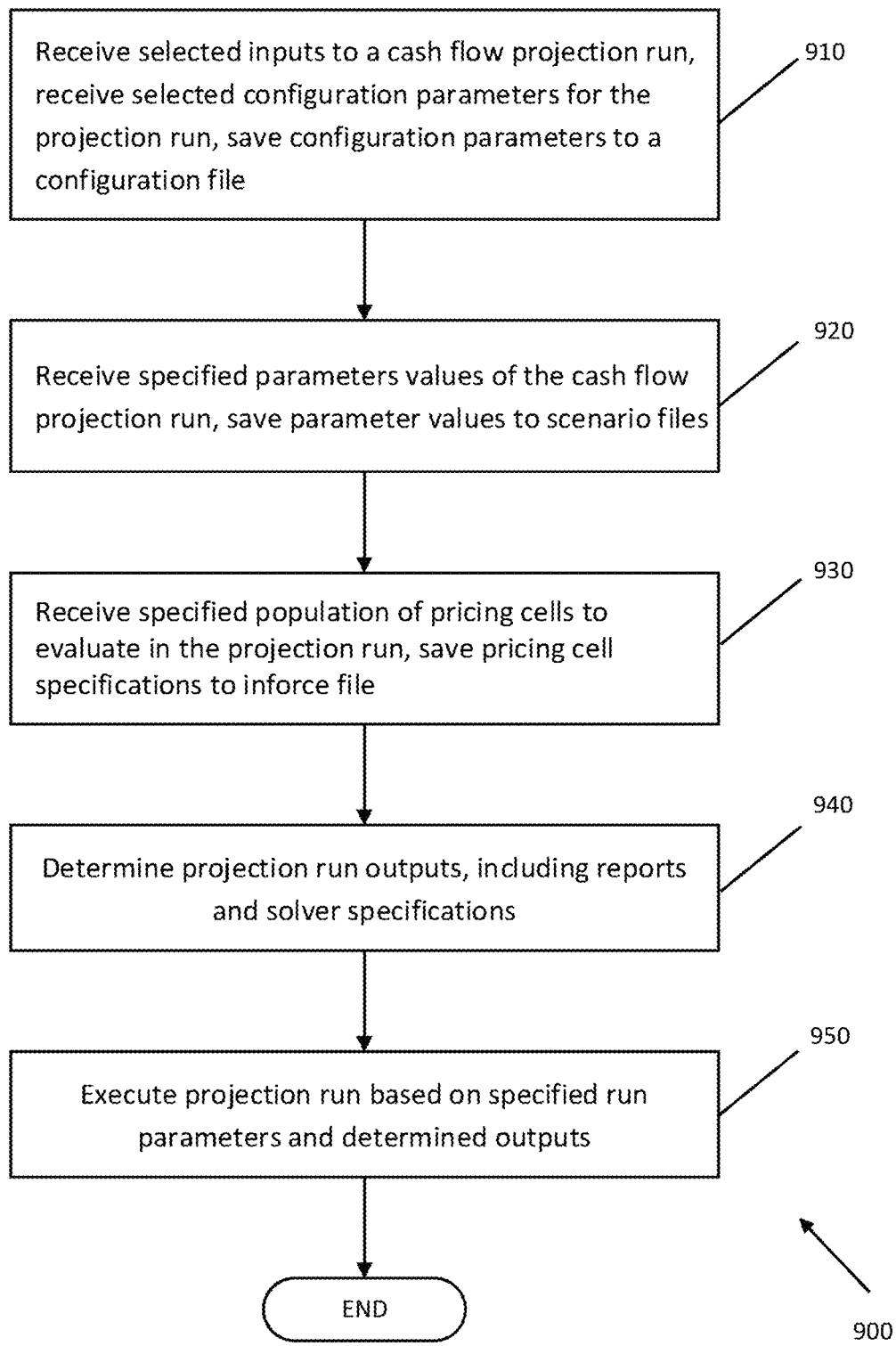
FIG. 9 is a flow chart schematic diagram of a method for specifying configuration parameters, specifying a population of pricing cells, and setting input/output parameters for a projection run, according to an embodiment.

Steps of a processor-based method for setting up and executing a projection run are shown in the flow chart schematic diagram of FIG. 9. At step 910, the processor receives selected input file names to a cash flow projection run, and receives selected configuration parameters for the projection run. The processor in communication with non-volatile memory stores the input file names and configuration parameters to a configuration file. In an embodiment, the configuration file is a config .json file. Illustrative configuration parameters include a number of years to include in the projection, and pricing and valuation variables for an actuarial projection.

At step 920, the processor receives specified parameter values for the cash flow projection run. Specified values may include product features and assumptions, reserve assumptions, and market scenarios. These values are stored in miscellaneous files, including a scenario file.

In an illustrative embodiment of step 920, the processor receives parameter values included a scenario file with a set of inflation and discount rates to the cash flow model. The file had three fields: time, interest_rate, and inflation_rate. Time is the time in months from the start of the projection (t=0). Interest_rate and inflation_rate are the monthly effective interest and inflation rates to be applied within the projection to discount cash flows and to inflate expenses, respectively. In an embodiment, a user device 190 can call a Python object of the cash flow tool 110 to generate a new scenario file.

At step 930, the processor receives specifications for a population of pricing cells to evaluate in the projection run, and saves pricing cell specifications to a policy census file. In various embodiments, these specifications are stored in a policy census file also herein referred to as "inforce file" such as an inforce .csv file. In an embodiment, the population of pricing cells of the inforce file comprises a pool of placed policies to simulate in a given projection. The inforce file provides the core census information for the simulated population including set of pricing cells and weights of those cells to run in the projection. The actuarial projection tool 100 uses the inforce file and population builder engine 430 to cover all pricing cell permutations.

In an embodiment, fields of an inforce file included product (name of the product that will correspond to applicable assumptions and rates for the cells); term-(term or duration of the product); and face (face amount of the contract). Other fields track attributes of each cell including: gender (gender of the cell; M/F); uw_class (underwriting class of the cell-UP, SP, S); tobacco (tobacco status of the cell-NT, T); issue_age (issue age of the cell); uw_channel (how the cell was underwritten, e.g., Manual, Algorithmic, Accelerated); app_to_issue_rate (ratio of issued policies to applications for the cell). app_to_issue_rate was used to calculate acquisition expenses.

In an embodiment, the inforce file was generated by the user using a file utility. In an embodiment, the user specified the possible values for each of the fields via list terms. The utility then generated an inforce file containing all the permutations of those field values.

In an embodiment, the inforce file was generated using cell keys. Cell keys are a special type of index used throughout the actuarial projection input files. These cell keys correspond to cell identities in the policy census file. In an embodiment, respective cell keys index one or more pricing cell specifications to cell identities in the policy census file. In an embodiment, when an input file takes a cell key as an input the user can specify as many or as few of the options that are available. For example, to specify an expense file that varies only by product and term attributes, only those two attributes (columns) would be included in the cell key. In an embodiment, in order for an assumption to vary by a given cell key, the assumption file provides for all the values of that cell key that appear in the policy census. In an embodiment, a file utility permits entering cell key values as ranges or sets.

In a first example cell key, the user wishes the expense file to vary only by Product and Term, and selects only these columns to include in the cell key. Pseudocode for the first example is as follows:
  cell keys=Product
  1 product, basis, face, issue_age, comm, prem, pol, k_face, app
  2 CP_Term, Marginal, "[100,250)", "(0, 40]", 0, 0, 350, 0, 0
  3 CP_Term, Marginal, "[250,500)", "(0, 40]", 0, 0, 345, 0, 0

In a second example cell key, the user wishes the expense file to vary only by Product, and selects only this column to include in the cell key. Pseudocode for the second example is as follows:
  cell keys=Product and Term
  1 product, term, 0, 1, 2, 3, 4, 5, 6, 7, 8, 9, 10
  2 CP_Term, 0, 0, 0, 0, 0, 0, 0.02, 0.02, 0.02, 0.02, 0, 02, 0
  3 CP_Term, 10, 0, 0, 0, 0, 0, 0.02, 0.02, 0.02, 0.02, 0.02, 0

In a third example cell key, the assumption file includes FACE and ISSUE_AGE and provides them in range form. Pseudocode for the third example is as follows:
  cell keys=Face and Issue_Age
  1 face, issue_age, multiplier
  2 "[100, 250)", "[18, 40)", 0.997
  3 "[250, 500)", "[18, 40)", 0.9895
  4 "[500, 1000)", "[18, 40)", 0.9895
  5 "[1000, 5000)", "[18, 40)", 0.9861
  6 "[5000, 30000)", "[18, 40)", 0.9775

In an embodiment, the cell key file input supports range notation that can use [ to indicate the range is inclusive of the value, and can use ( to indicate the range is exclusive of the value. In an embodiment, range notation also includes [–inf_and_inf] to specify a value that applies all the way up to an unknown upper bound value.

In an embodiment, the cell key file input also supports sets notation. The user can provide sets of cell keys that are strings or categorical variables. For example, in a cell key including uw_class, the user could specify: {UP, SP} which would result in the specified value being applied to both UP and SP cells.

In an embodiment, the cell keys may incorporate differences as applied to policy census files in different embodiments of Predictive Services 400 (as shown in FIG. 4). For example, in predictive services 410 that incorporate mortality tables of a clinical underwriting model (e.g., clinical underwriting model 714 of FIG. 7), the population builder engine 430 may embody differences in cell key protocols from predictive services 410 that incorporate mortality tables of a fluidless underwriting model (e.g., fluidless underwriting model suite 810 of FIG. 8).

Various instances of cell keys, and value types and options for each of these cell keys, are shown in Table 3.

TABLE 3

| Cell Keys | | |
|---|---|---|
| Cell_Key | Value Type | Options |
| product | string | set |
| term | string | set |
| gender | string | set |
| uw_class | string | set |
| tobacco | string | set |
| uw_channel | string | set |
| premium_mode | string | set |
| issue_age | int | range |
| face | int | range |

In an embodiment, in addition to cell keys, the file index may include any assumption-specific required indices.

Figure 10:
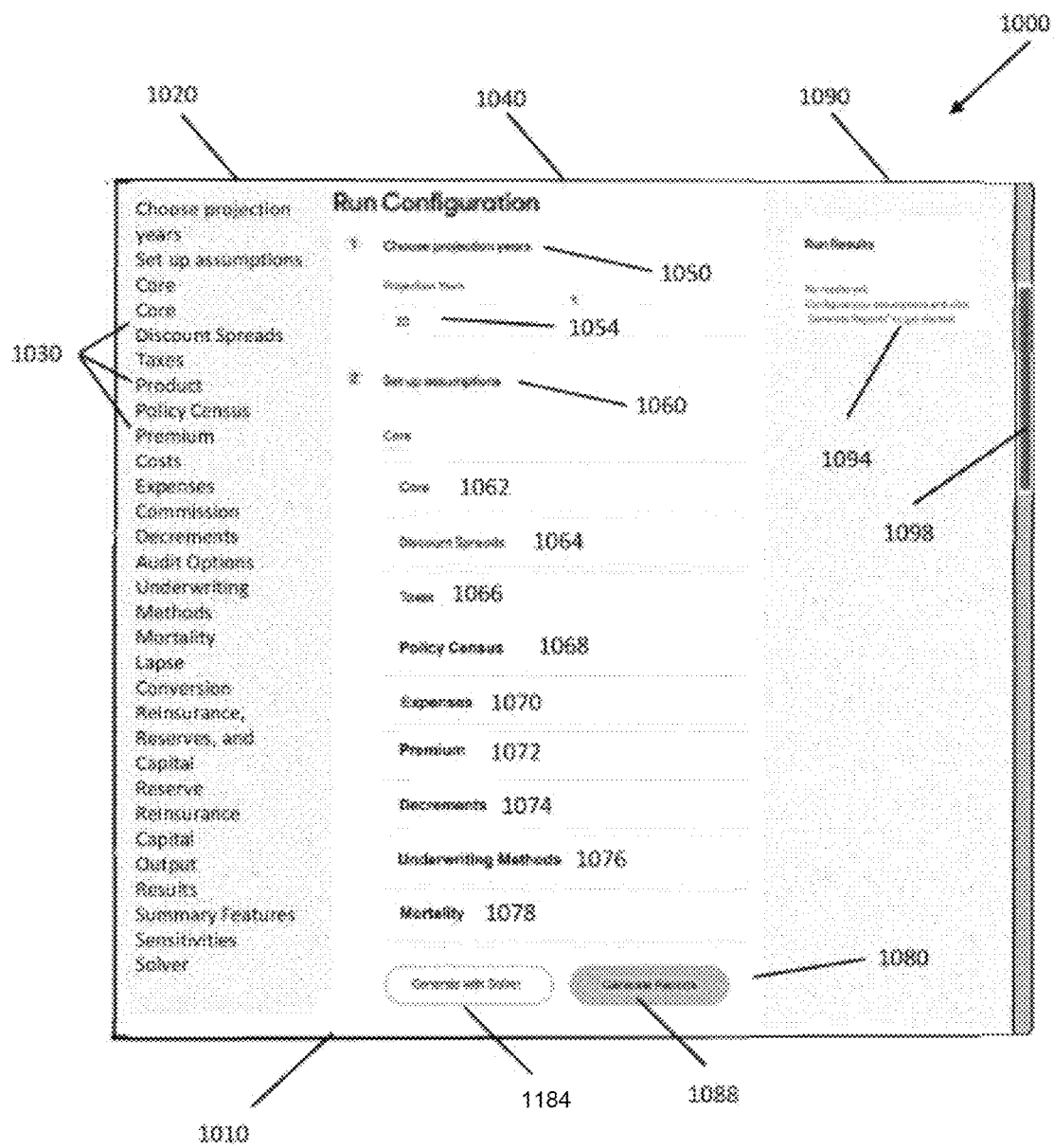
FIG. 10 is a representative view of a user interface of an actuarial projection system, according to an embodiment.

FIG. 10 is a representative view of a graphical user interface (GUI) 1010 of an actuarial projection system 1000. The GUI 1010 serves as an input/output interface to specify inputs and specify configuration parameters for a given run (also herein referred to as projection or projection run), to specify outputs of a projection run, and to execute a projection run of an actuarial projection system 1000. The GUI 1010 includes a field list region 1020 at a left panel of the GUI, a run configuration region 1040 at a center panel of the screen, and a run output region 1080 at a right panel of the GUI. In an embodiment, field list region 1020 displays a list file menu of input file names 1030 that correspond to input files displayed in the run configuration region 1040.

In an embodiment in which GUI 1010 only displays a portion of the run configuration region 1040 at one time, the user may navigate to a portion of the run configuration region 1040 corresponding to a given input file by clicking on the appropriate input file name 1030 in the field list region 1020 to jump to that input file. Alternatively, the user can scroll up or down to that input file using scroll bar 1098. In the view of FIG. 10, the run configuration region 1050 of user interface 1010 displays a portion of the file names from the field list region 1030, including a Choose Projection Years control 1050 and several file names shown at Set-up Assumptions section 1060. Displayed file names include Core 1062, Discount Spreads 1064, Taxes 1066, Policy Census 1068, Expenses 1070, Premium 1072, Decrements 1074, Underwriting Method 1076, and Mortality 1078.

Figure 11:
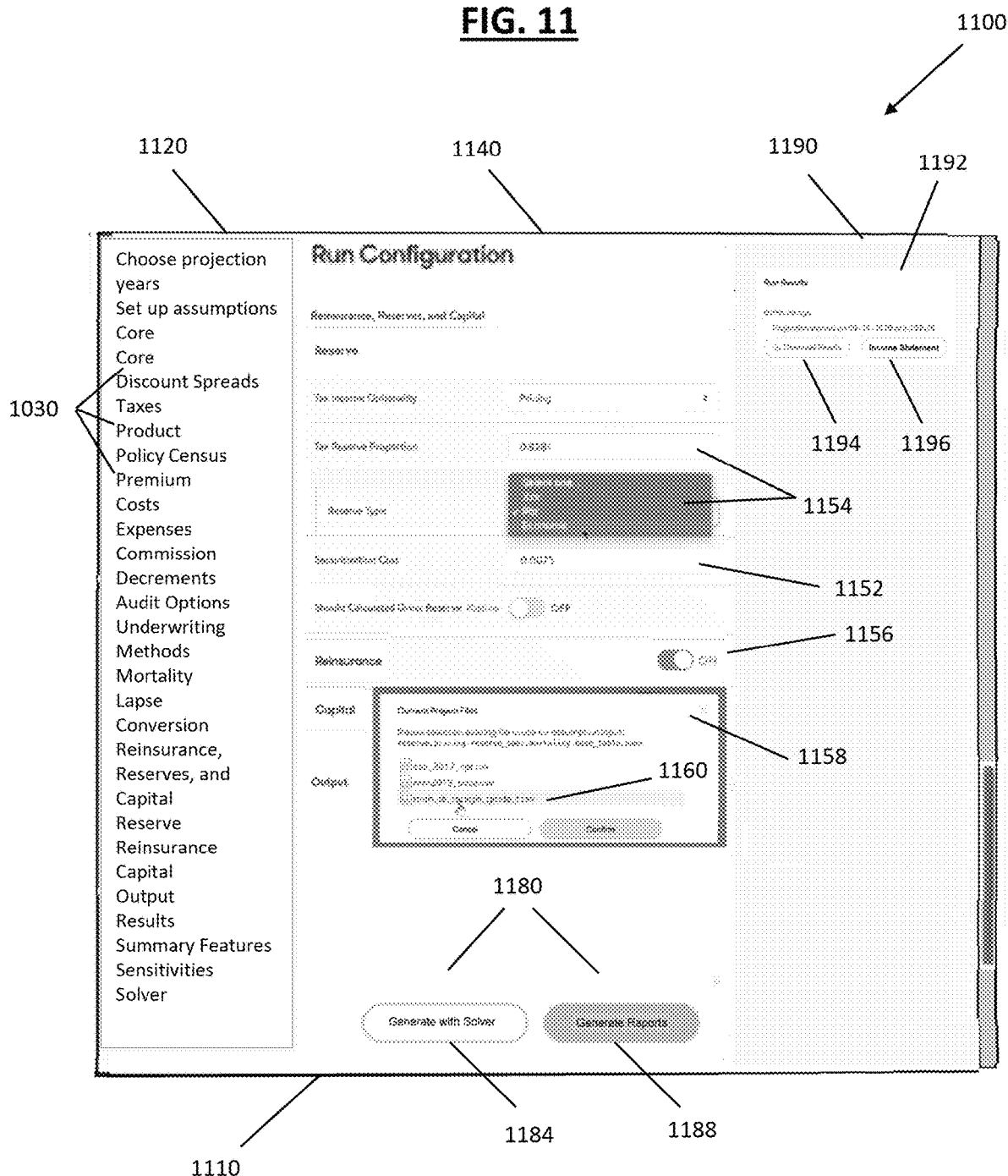
FIG. 11 is a representative view of a user interface of an actuarial projection system, according to an embodiment.

FIG. 11 shows a representative view of a GUI 1110 of an actuarial projection system 1100. Components of GUI 1110 include a field list region 1120 at a left panel of the GUI, a run configuration region 1140 at center panel of the screen, and a run output region 1180 at a right panel of the GUI, generally corresponding to corresponding portions of the GUI 1010. FIG. 11 shows a view of run configuration region 1140 in which various file sections of GUI 1110 have been expanded to show run configuration controls.

Run configuration controls can incorporate various GUI elements employed in input forms, such as web forms. Illustrative input elements shown in FIG. 11 include text boxes 1152, selection boxes 1154, toggle buttons 1156, file select controls 1158, and action buttons 1180. Text boxes 1152 can specify values for various parameters of a projection run. Selection boxes 1154 can include, e.g., radio buttons, check boxes, and drop down lists. File select control 1158 can select a file name 1160 of a projection assumptions file, e.g., saved from a previous run, and load the file to include in the current run assumptions. For example, the file select control can select and load a scenario file. Action buttons 1180 include a Generate with Solver button 1184 and a Generate Reports button 1188, each of which requests a run output.

FIG. 10 shows the Run Results pane 1090 prior to generating any results. In order to generate and display results, the user clicks the Generate Reports button 1088 to get started. FIG. 11 shows the Run Results pane 1190 after clicking the Generate Reports button 1188. Run Output pane 1190 displays the day and time of generating results, and action buttons for requesting output including a Download Results button 1194 and an Income Statement button 1198.

Figure 12:
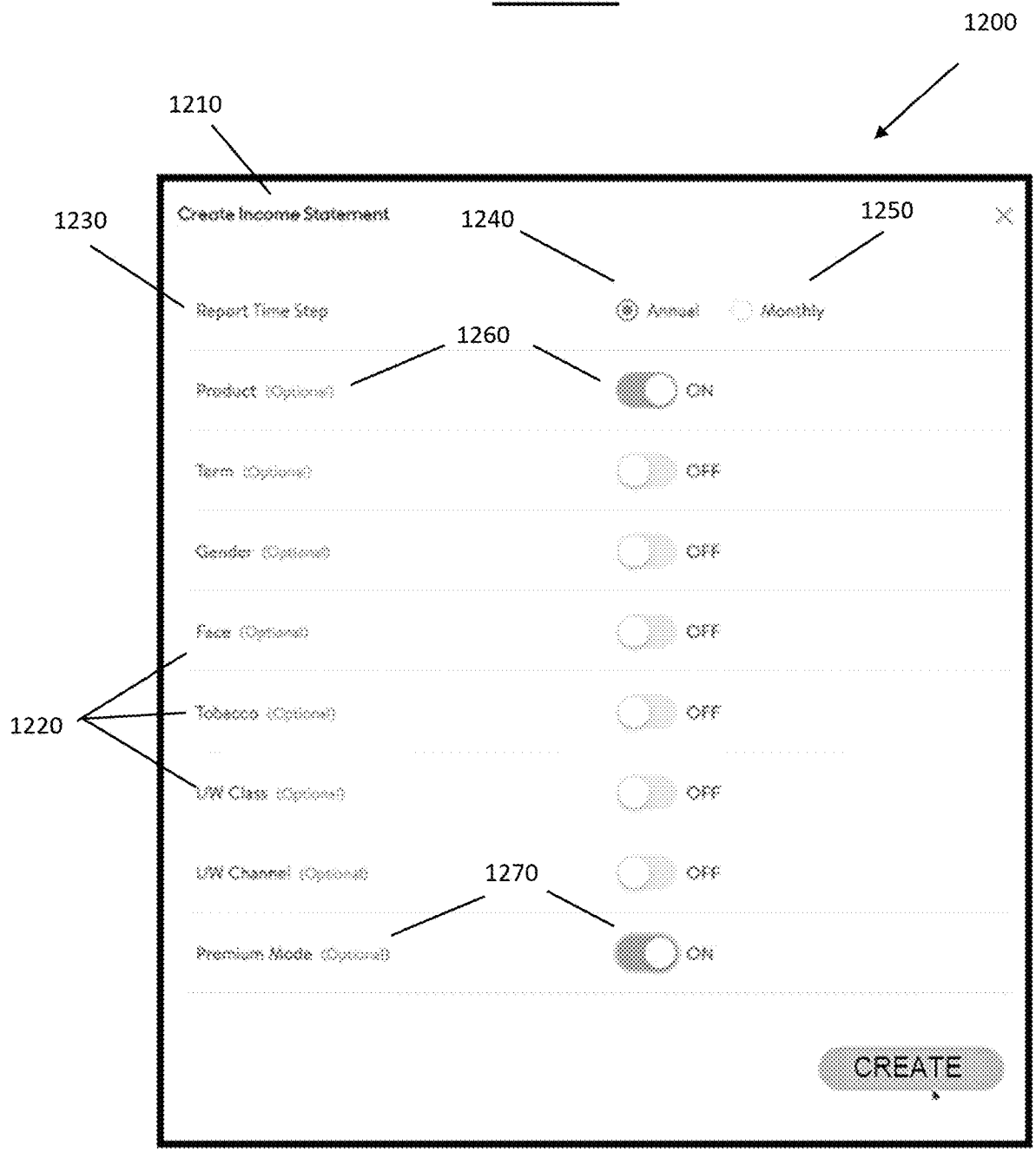
FIG. 12 is a representative view of a user interface of an actuarial projection system, according to an embodiment.

In an illustrative embodiment as shown in FIG. 12, in response to a user clicking the button 1198 to generate an Income Statement, the system displays a dialog box 1200 at which user can enter configuration parameters for an income statement 1210. Using the radio buttons at Report Time Step 1230, the user selects the time step of the income statement, either annual 1240 or monthly 1250. The user can turn on one or more optional configuration parameters listed at the left side of the dialog box, by moving the corresponding toggle button to the right, "on," position. FIG. 12 shows Product 1260 and Premium Mode 1270 activated.

Figure 13:
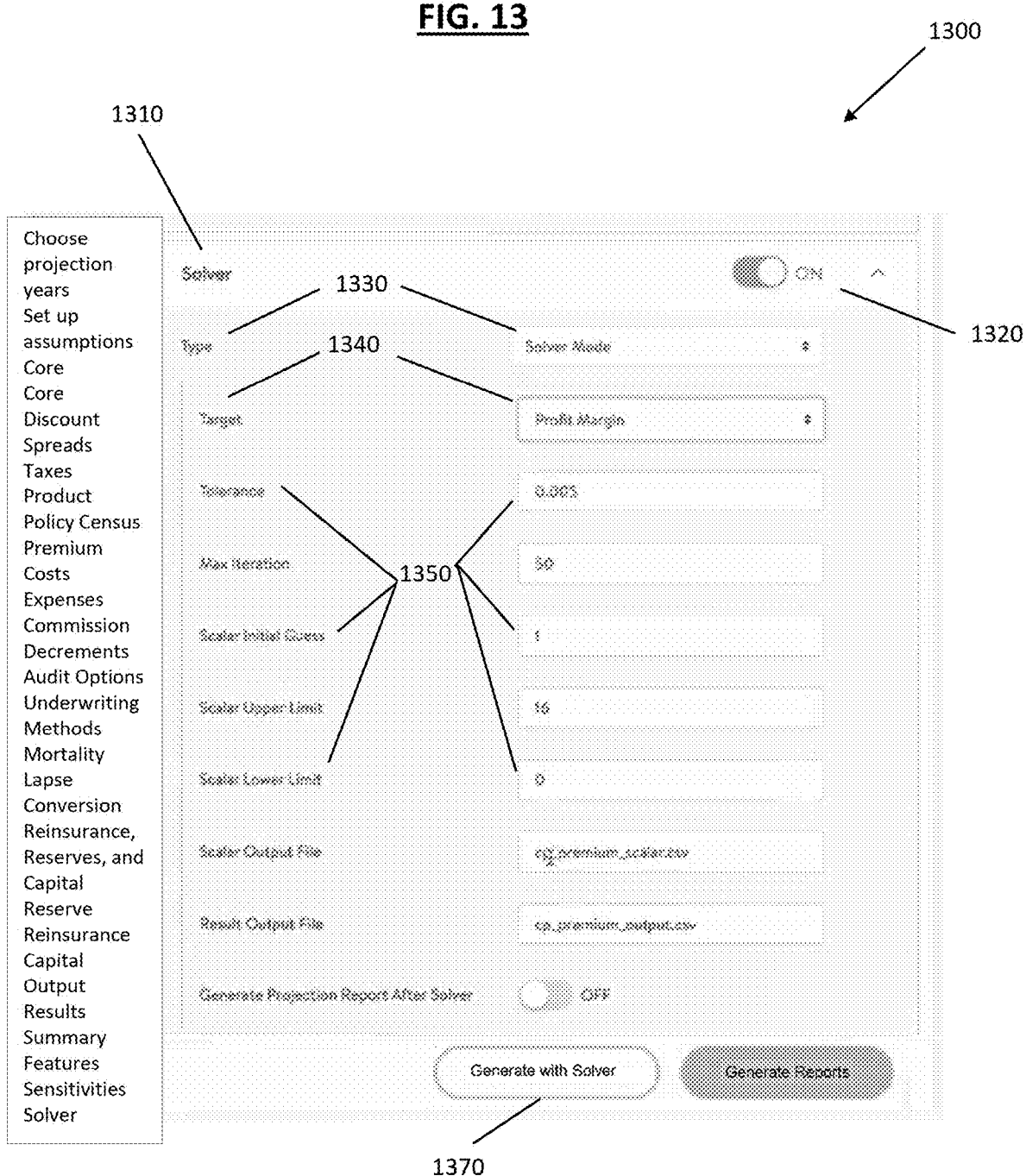
FIG. 13 is a representative view of a user interface of an actuarial projection system, according to an embodiment.

In the GUI 1300 shown in FIG. 13, in response to clicking the action button 1370 Generate with Solver, the system displays run configuration section 1310 to specify parameters of a profitability solver, such as a solver to be included in projection reports. Toggle button 1320 is in the "on" position. In an embodiment, a profitability solver determines an optimal value for a profitability metric in one cell of a worksheet subject to constraints on the values of other formula cells on a worksheet. GUI 1300 displays parameters of solver mode, as shown at Type field 1330. The "profit margin" value displayed at Target selection control 1340 indicates that that the solver is to find an optimal value for that profitability metric. Text box fields 1350 specify solver configuration values such as parameters of scalar objective functions.

Referring again to FIG. 10, the Projection Years control 1060 enables users to specify integers designating the number of years 1054 for which the projection is run.

Core section 1062 receives required run configuration inputs that generate a Scenario file. In an embodiment, the Scenario file specifies interest and inflation rate vectors for the projection. In various embodiments, the Scenario file may include some or all of the columns shown in Table 4. In an embodiment, the following inputs are required: time; best_estimate_interest_rate; deterministic_reserve_interest_rate; deterministic_reserve_inflation_rate; reserve_earned_rate, surplus_capital_earned_rate. In an embodiment, all rates are pre-tax and annual.

TABLE 4

Scenario File (CORE)

| Column Name | Description |
| --- | --- |
| time | Projection year index for the scenario; e.g., with base 0 |
| best_estimate_interest_rate | Best estimate interest rate for the projection for the given timestep |
| best_estimate_inflation_rate | Best estimate inflation rate for the projection for the given timestep |
| deterministic_reserve_interest_rate | Deterministic reserve interest rate vector |
| deterministic_reserve_inflation_rate | Deterministic reserve inflation rate |
| annuity_interest_rate | Best estimate annuity certain discount rate for benefits paid out as annuities |
| lump_sum_interest_rate | Best estimate lump sum discount rate for benefits paid out as annuities where the cell has elected the lump sum |
| pbr_annuity_interest_rate | Deterministic reserve annuity certain discount rate (VM-22) for benefits paid out as annuities |
| pbr_lump_sum_interest_rate | Deterministic reserve lump sum discount rate for benefits paid out as annuities where the cell has elected the lump sum |
| reserve_earned_rate | Vector of earned rates on the reserve and other cash-like balances |
| surplus_capital_earned_rate | Vector of earned rates on required and surplus capital balances |

In an illustrative embodiment, other Core inputs 1062 include Maturity Age, a user-specified integer specifying attained age at which the contract matures. Post Level Term is a switch that allows the user to turn on or off the post-level term portion of the contract projection off. When this switch is on, the projection will include the Post Level Term. When this switch is off the model with inject 100% lapse at the end of the level term.

In an illustrative embodiment, the Discount Spreads control 1064 specifies an additional spread over the best estimate discount rate for Value of New Business (VNB) from the scenario file, used for discounting in a PV report for the VNB.

The user can set the income tax rate and the premium tax rates via Taxes control 1066. The user also can chose to directly model DAC taxes by populating the DAC Tax Capitalization Amount and the Amortization period.

The Policy Census input file 1068 contains the policy census, also herein called inforce file. In an embodiment, Policy Census can assume one of two formats, a Flat format and an Independent Distribution format. The flat format is essentially a list of cells to simulate. In various embodiments, the Policy Census file may include some or all of the columns shown in Table 5. In an embodiment, the following columns are required: product_type; product; term; face; gender, uw_class; tobacco; issue_age; uw_channel; premium_mode.

TABLE 5

Policy Census (Flat format)

| Column Name | Description |
| --- | --- |
| product_type | The product chassis. Example: includes values TERM, WHOLE LIFE, Worksite Benefit |

TABLE 5-continued

Policy Census (Flat format)

| Column Name | Description |
| --- | --- |
| product | User specified product name. This name should correspond to all other references to product in the assumption set. Examples: ITM and CP_Term |
| cell_id | When running a policy inforce, this attribute is used to pass policy numbers or other policy index values into the projection |
| term | Term duration of the cell. This can be chosen by the user so long as the other instances where this key is used have the index value they have selected. Examples: 0, 10, 15, 20, 25, 30 |
| face | Face amount of the cell in thousands. In the case of Worksite Benefit life products this is the monthly benefit. |
| gender | Gender of the cell. This can be chosen by the user as long as the other instances where this key is used have the index value they have selected. Examples: M, F, U |
| uw_class | Risk class of the cell. This can be chosen by the user as long as the other instances where this key is used have the index value they have selected. Examples: UP, SP, S |
| tobacco | Tobacco status of the cell. This can be chosen by the user as long as the other instances where this key is used have the index value they have selected. Examples: NT, T |
| issue_age | Issue age of the cell. This can be chosen by the user as long as the other instances where this key is used have the index value they have selected. Examples: 25, 30, 35 |
| uw_channel | Underwriting path the cell took to issue. This can be chosen by the user as long as the other instances where this key is used have the index value they have selected. Examples: algorithmic, litetouch, manual |
| app_to_issue_rate | Rate of issued policies to applications for the cell. This value should be on [0, 1] |
| premium_mode | Mode of the premium payment for the cell. In an embodiment, takes values MONTHLY, QUARTERLY, or ANNUALLY. |
| target_value | Target profit metric value for the cell. In an embodiment, this attribute is only needed when running the solver. |
| count | Count of policies that this cell represents in the census. Used, e.g., to run a distribution of cells, but with more control than the 'Independent Distribution' option. |
| lump_sum | This attribute indicates that the cell specified has elected to receive benefits as a lump sum. |

Disclosed embodiments of the Expenses input 1070 provide a high degree of flexibility in specifying assumption flows. At the highest level, users can separate base expenses from selling related expenses. In an embodiment, categories and the specifications of the data are essentially the same within selling and base expense categories, but the user can differentiate them in reporting. Each of the expense categories follows the same specification pattern.

Expense files can include various Expense Items within the selling and base categories:

(1) Acquisition—Expenses charged at time 0 to acquire the policy. In the case of base expenses acquisition expenses might include items such as underwriting costs and fees associated with issuing the policy. In the case of selling expenses acquisition expenses might include travel & entertainment or marketing expenses allocated to the cell.

(2) Maintenance—Expenses are charged annually at the beginning of the policy year if the policy is in force.

(3) Lapse, Claim, and Conversion—Expenses charged upon the occurrence of the respective termination event.

(4) QBIC—Expense charged to cover additional commissions paid out in the event of policyholder persistency.

(5) Other—An open expense item that allows users to pass through additional expenses without conflating them with Maintenance and that allows different inflation treatment than maintenance.

The user can select the Expense Basis at the selling/base level, e.g., via a drop-down menu with two options: Full and Marginal.

During run configuration the user can independently toggle Inflation on or off. In an embodiment, if the user turns on inflation for any given expense, the expense value will be inflated on a monthly basis based on the sequence of annual rates provided in the scenario file.

At Premium 1072, in specifying the premium rates for a term policy projection the user can set run configuration via two toggled parameters: (a) Unearned Premium Refund—when this is toggled on the portion of premium that is unearned will be refunded to the customer in the event of a mid-year termination. (b) Enabled Guaranteed Premium—when this is toggled on, the projection will use Max (current, guaranteed) for the premium rates. When this is toggled off, the projection will use the current premium rates.

At Decrements 1074, the actuarial projection system permits configuration of three types of decrements: (a) Mortality-projection that a given individual dies; (b) Lapse—projection that given policy terminates due to premium non-payment or active policy ending in a given period; (c) Conversion—projection that given term policy terminates because the customer converted the contract to a permanent product.

At the Underwriting Methods 1076, the user can assign all of the underwriting method assumptions. In an embodiment, Underwriting Methods controls 1076 allow the user to provide a cell key called uw_method, which enables users to provide assumptions that vary by underwriting path (e.g., accelerated, algorithmic, etc.).

Mortality assumptions 1078 include various components:

(1) Base Table—The base mortality table that will be used for the given mortality assumption. The system supports a number of different base table formats including:
- (a) Duration—In this format the base table has cell key as the index and duration as the row headers.
- (b) Select and Ultimate—This format includes two base tables, a Select table with cell key as the index and duration as the row headers, and an Ultimate table that includes cell key as the index and attained age as the row headers.

(2) Select/Grade Risk Multiples-Includes additional mortality adjustment factors that can be applied for a given number of years (Select period), then graded off linearly over a period of time (Grade Period). The use of risk multiples is optional; this function can be toggled off. Within this section, the user has several options:
- (a) Type (Capped, Uncapped)—This applies an additional degree of grade limitation on the mortality adjustment factors. In the Capped option the select adjustment factor will be applied for the lesser of the select and grade period, and fully graded off by the time the cell reaches attained age 90. In the Uncapped option, the adjustment factors will be applied at 100% for a specified number of durations, then will be graded to 1.0 over a selected grade_period regardless of the cell characteristics.
- (b) Risk Multiples—This is a user-provided table that should vary by cell key and should include a selected multiplier, the adjustment factor that will be applied to the mortality rates in the assumption.
- (c) Post Level Term Multiples—This optional feature allows users to input multiples that are applied to the mortality table in the Post Level Term. A duration format allows users to input cell keys as the y-index plus the special attribute premium_jump. In an embodiment, the premium_jump attribute can be passed as an interpolation index in a shock lapse file. In an example, the user provides values for premium_jump of 2 and premium_jump of 3. If the actual jump were 2.3, the system would interpolate linearly between the two provided values to calculate the value to be applied.
- (d) Table Rating, Flat Extras—These two optional inputs specify specific levels of excess mortality associated with the given table or flat format included in the census.

The user can specify different mortality assumptions to allow for variation by underwriting method. In an illustrative embodiment, an Accelerated mortality section of GUI 910 has generally the same input options as a Traditional mortality section. However, the Accelerated section enables users to specify mortality slippage in Accelerated underwriting programs directly in the assumptions for policies obtained through that underwriting method.

Additional input file names are listed in the field list region 1030. These input file names and related run configuration parameters are not visible in the portion of the run configuration region 1050 shown in FIG. 10, but are accessed by navigating to additional portions of the run configuration region. Other input files include, for example:

PROFIT MARGIN: Profit Margin specifies an additional spread over the best estimate discount rate from the scenario file. This input enables discounting in PV reports for profit and profit margin.

COMMISSION: The user can toggle commissions on and off at the run configuration region 1050. Configuration options allow the user to specify distinct base and override commission structures, and to set features such as frequency and commission claw-back.

AUDIT OPTIONS: This run configuration section permits users to turn Decrements on or off within the projection. When toggled to Decrements Off, the projection will run but none of the best estimate decrements are applied to the cash flows, DECREMENTS—LAPSE: Lapse assumptions include three components that provide lapse decrement specifications:
- (1) Base Table—This is a user-supplied table of annual lapse rates. The base table has cell key as the index and policy year as the row headers. In an embodiment, this table is required.
- (2) Lapse Skew Table—This is a user-supplied monthly table of skew factors that spread the annual lapse rates from the base table over the course of a given policy year. The lapse skew table has cell key as the index and policy month as the row headers. In an embodiment, this table is required.
- (3) Shock Lapse Table—This is an optional user-supplied table that allows users to set shock lapse rates for the final year of the level term and the first year of the Post Level Term. In an embodiment, the shock lapse table includes an optional setting that activates premium_jump interpolation for Post Level Term Multiples in the Mortality assumptions.

DECREMENTS—CONVERSION: This assumption includes a third type of Decrement, Conversion, which is optional. Components include base table and conversion skew table that are generally similar to corresponding lapse tables, but do not include a table corresponding to the shock lapse table.

REINSURANCE, RESERVES, CAPITAL: This assumption includes specifications for two reserve bases, Statutory and Pricing. In an embodiment, Statutory reserve is always used for Risk-Based Capital (RBC) calculations. In an embodiment, the user has the option to set Statutory and Pricing as the driver for the tax reserves. Pricing reserve can be set to Principle-Based Reserves (PBR) or Economic. If set to PBR, the projection will use the Statutory reserve. If set to Economic, the Pricing reserve will drive the rest of the income statement, including increase in reserve strain and investment income on reserves.

In an embodiment, the Statutory reserve supports PBR under VM-20. The assumptions include three components used to determine PBR: Net Premium Reserve (NPR), Deterministic Reserve (DR), and Statutory Reserve. DR is included for term products in accordance with requirements of VM-20. The assumption includes specifications for decrements and expenses that are required in calculating Deterministic Reserves.

Figure 14:
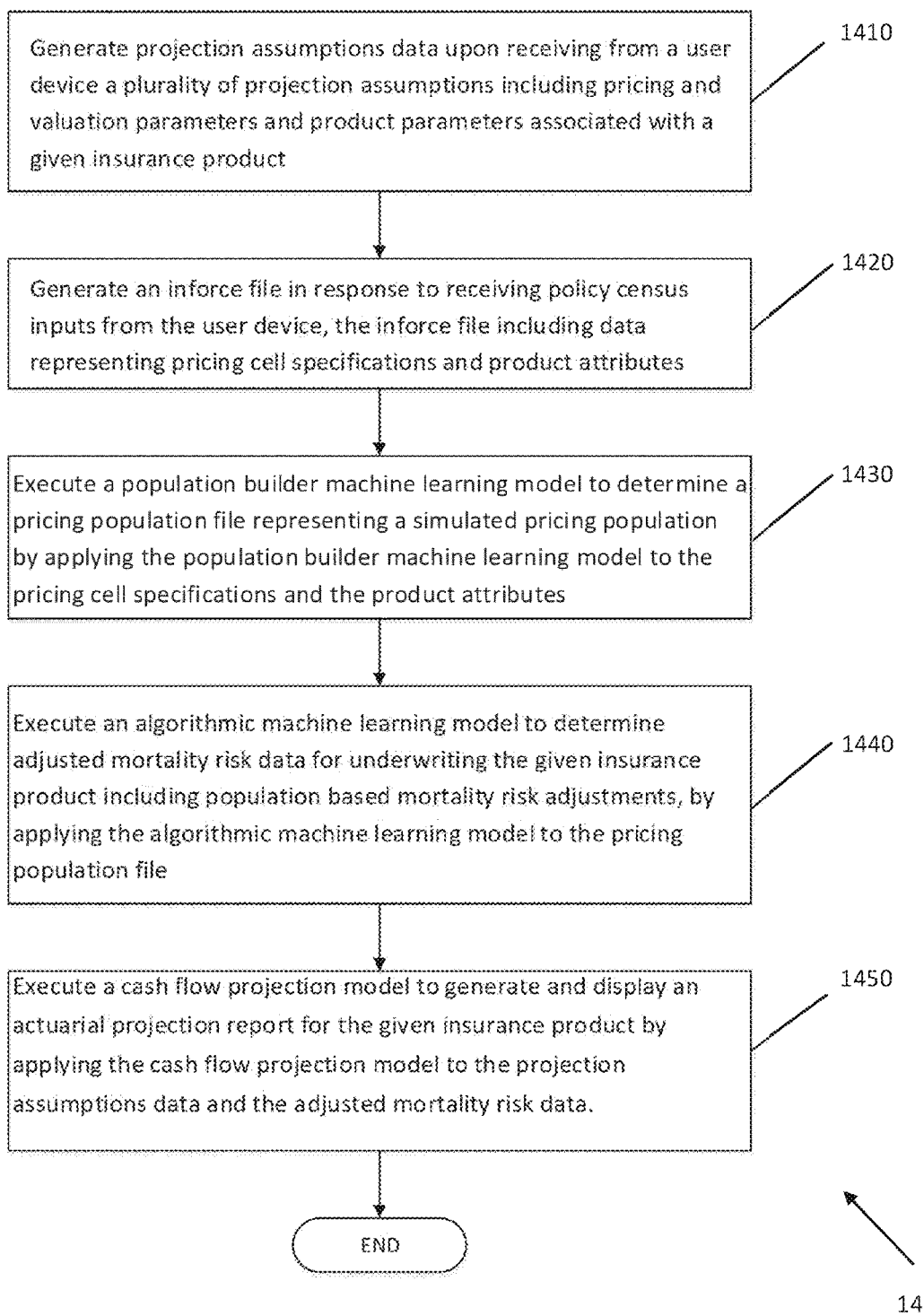
FIG. 14 is a flow chart schematic diagram of a method for specifying configuration parameters, specifying a simulated population of pricing cells, generating adjusted mortality risk data, and setting input/output parameters for a projection run.

FIG. 14 is a flow chart schematic diagram of a method for specifying configuration parameters, specifying a simulated population of pricing cells, generating adjusted mortality risk data, and setting input/output parameters for a projection run.

While various aspects and embodiments have been disclosed, other aspects and embodiments are contemplated. The various aspects and embodiments disclosed are for purposes of illustration and are not intended to be limiting, with the true scope and spirit being indicated by the following claims.

The foregoing method descriptions and the interface configuration are provided merely as illustrative examples and are not intended to require, or imply, that the steps of the various embodiments must be performed in the order presented. As will be appreciated by one of skill in the art, the steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed here may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code, with it being understood that software and control hardware can be designed to implement the systems and methods based on the description here.

When implemented in software, the functions may be stored as one or more instructions or codes on a non-transitory computer-readable or processor-readable storage medium. The steps of a method or algorithm disclosed here may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used here, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

What is claimed is:

1. A system for using a suite of interdependent artificial intelligence models to improve each individual model's efficiency, the system comprising:
a non-transitory computer-readable medium storing a computer program instructions, and a processor coupled to the non-transitory computer-readable medium and configured to execute the instructions to:
in response to receiving a plurality of projection assumption inputs from a user device,
execute a population builder machine learning model to:
predict a dynamic adjustment table in accordance with the assumption inputs, and
output a value population file representing a simulated population by applying the population builder model to population data, wherein the value population file comprises a set of value cells representing instances of a product, the simulated population corresponding to a subset of a population selected in accordance with the dynamic adjustment table predicted by the population builder machine learning model;
execute a mortality machine learning model to determine mortality data for the product by ingesting the value population file generated by the population builder machine learning model;
execute a flow projection model to output for display at the user device a projection report for the product by applying the flow projection model to the mortality data ingested from the mortality machine learning model in addition to projection assumptions data based on the plurality of projection assumption inputs, wherein the projection assumptions data represent assumptions for the flow projection model; and
generate a product file comprising code that represents the product and the projection report.

2. The system of claim 1, wherein the processor is further configured to execute the instructions to:
generate the population data in response to receiving a plurality of population inputs from the user device, wherein the population data represent value cell specifications associated with the product.

3. The system of claim 2, wherein the population data comprise a plurality of cell keys, wherein respective cell keys index one or more of the value cell specifications to cell identities in the population data.

4. The system of claim 1, wherein the projection assumptions data comprises valuation parameters associated with the flow projection model.

5. The system of claim 4, wherein the valuation parameters include decrement parameters representative of mortality and lapse decrements.

6. The system of claim 1, wherein the projection assumptions data comprise product features and market scenarios.

7. The system of claim 1, wherein the set of value cells represent inforce instances of the product, and the set of value cells include weightings of respective pricing cells in the simulated population.

8. The system of claim 1, wherein the mortality data for the product comprise adjusted mortality variables including population based mortality adjustments based on the simulated value population.

9. The system of claim 8, wherein the adjusted mortality variables comprise adjusted mortality tables including population based table adjustment surfaces determined via analysis of the value population file.

10. The system of claim 1, wherein the flow projection model is communicatively coupled with the machine learning model via a call-response interface that handles API (application programming interface) calls from the flow projection model and responses from the machine learning model.

11. The system of claim 1, wherein the processor is further configured to execute the instructions to:
train the machine learning model by applying survival modeling to a plurality of historical application records.

12. The system of claim 1, wherein the processor is further configured to execute the instructions to:
execute the machine learning model to generate value prediction data representative of one or both of a placement rate and a premium persistency rate; and
execute the flow projection model to output the projection report by applying the flow projection model to the value prediction data.

13. The system of claim 1, wherein the flow projection model is further configured to execute a profitability solver, wherein the projection report comprises profitability data.

14. A method for using a suite of interdependent artificial intelligence models to improve each individual model's efficiency, the method comprising:
receiving, by at least one processor, a plurality of projection assumption inputs from a user device;
executing, by the at least one processor, a population builder machine learning model to:
predict a dynamic adjustment table in accordance with the assumption inputs, and
output a value population file representing a simulated population by applying the population builder model to population data, wherein the value population file comprises a set of value cells representing instances of a product, the simulated population corresponding to a subset of a population selected in accordance with the dynamic adjustment table predicted by the population builder machine learning model;
executing, by the at least one processor, a mortality machine learning model to determine mortality data for the product by ingesting the value population file generated by the population builder machine learning model; and
executing, by the at least one processor, a flow projection model to output for display at the user device a projection report for the product by applying the flow projection model to the mortality data ingested from the mortality machine learning model in addition to projection assumptions data based on the plurality of projection assumption inputs, wherein the projection assumptions data represent assumptions for the flow projection model; and
generating, by the at least one processor, a product file comprising code that represents the product and the projection report.

15. The method of claim 14, further comprising:
generating, by the at least one processor, the population data in response to receiving a plurality of population inputs from the user device, wherein the population data represent value cell specifications associated with the product.

16. The method of claim 15, wherein the population data comprise a plurality of cell keys, wherein respective cell keys index one or more of the value cell specifications to cell identities in the population data.

17. The method of claim 14, wherein the projection assumptions data comprises valuation parameters associated with the flow projection model.

18. The method of claim 17, wherein the valuation parameters include decrement parameters representative of mortality and lapse decrements.

19. The method of claim 14, wherein the projection assumptions data comprise product features and market scenarios.

20. The method of claim 14, wherein the set of value cells represent inforce instances of the product, and the set of value cells include weightings of respective pricing cells in the simulated population.

\* \* \* \* \*